United States Patent
Nishimiya et al.

[11] Patent Number: 6,030,748
[45] Date of Patent: Feb. 29, 2000

[54] PHOTOSENSITIVE LITHOGRAPHIC PRINTING PLATE HAVING A LAYER OF A HYDROLYZED AND POLYCONDENSED ORGANOMETALLIC COMPOUND

[75] Inventors: Nobuyuki Nishimiya; Tatsuji Higashi; Tadahiro Sorori, all of Shizuoka, Japan

[73] Assignee: Fuji Photo Film Co., Ltd., Minami Ashigara, Japan

[21] Appl. No.: 08/828,543

[22] Filed: Mar. 31, 1997

[30] Foreign Application Priority Data

Apr. 1, 1996 [JP] Japan ................................... 8-078868

[51] Int. Cl.⁷ ............................... G03C 1/91; G03C 1/77; B41M 1/08
[52] U.S. Cl. ..................... 430/271.1; 430/18; 430/278.1; 430/281.1; 430/302; 430/955; 101/453; 101/459
[58] Field of Search .................................... 430/18, 270.1, 430/302, 955, 281.1, 278.1, 271.1; 101/453–462

[56] References Cited

U.S. PATENT DOCUMENTS

| | | | |
|---|---|---|---|
| 5,204,143 | 4/1993 | Nishimiya et al. | 427/387 |
| 5,464,724 | 11/1995 | Akiyama et al. | 430/272.1 |
| 5,807,659 | 9/1998 | Nishimiya et al. | 430/302 |

FOREIGN PATENT DOCUMENTS

| | | | |
|---|---|---|---|
| 61-9621 | 3/1986 | Japan | G03C 1/68 |
| 63-178105 | 7/1988 | Japan | C08F 2/50 |
| 2-244050 | 9/1990 | Japan | G03F 7/028 |
| 7-159983 | 6/1995 | Japan | G03F 7/00 |

*Primary Examiner*—Bernard Codd
*Attorney, Agent, or Firm*—Burns, Doane, Swecker & Mathis, LLP

[57] ABSTRACT

A photosensitive lithographic printing plate comprising a substrate having provided on the surface thereof a photosensitive layer through a layer which is formed by coating and drying a composition prepared by hydrolyzing and polycondensing a compound represented by formula (I) in a solvent having dissolved therein a phenol having a molecular weight of 1,000 or less or an organic phosphoric acid compound:

$$A_m M(R)_n \quad (I)$$

wherein M represents silicon, aluminum, titanium or zirconium, A represents a hydrogen atom, an alkyl group, an aryl group, an alkenyl group, a propargyl group, an alkoxy group, an epoxyalkyl group, a silyl group, a siloxy group or a functional group capable of addition reaction by a radical, m and n each represents 0 or a positive integer, provided that m+n=3 or 4, and R represents one of the groups (a) to (e) defined in the specification.

6 Claims, No Drawings

PHOTOSENSITIVE LITHOGRAPHIC PRINTING PLATE HAVING A LAYER OF A HYDROLYZED AND POLYCONDENSED ORGANOMETALLIC COMPOUND

FIELD OF THE INVENTION

The present invention relates to a photosensitive printing plate, more specifically, the present invention relates to a photosensitive lithographic printing plate (hereinafter simply referred to as a "PS plate") capable of direct writing by laser light.

BACKGROUND OF THE INVENTION

Conventionally, the negative PS plate has been widely known and includes those using a photosensitive layer containing a diazo resin which is cured on exposure to light, those using a photopolymerizable photosensitive layer and those using a photo-crosslinkable photosensitive layer. The term "photopolymerizable" or "photo-crosslinkable" as used herein means such a property that the organic layer is caused to undergo polymerization or crosslinking due to an active species generated by light. To make a printing plate from such a PS plate, an original of a transparent negative film is placed on the PS plate having the above-described photosensitive layer and the plate is then exposed to an ultraviolet ray. Even when the original comprises letters, a part of the original must be once reproduced on the film before exposing the PS plate to the ray, thus, the operation is cumbersome. Accordingly, attempts have been intensively made to directly prepare a printing plate without using any film original, where a PS plate using a certain high-sensitive, polymerizable layer as the photosensitive layer is scanned with an acutely narrowed laser beam to form a letter original or an image original directly on the plate. A printing plate can be directly made using a photosensitive composition described, for example, in JP-B-61-9621 (the term "JP-B" as used herein means an "examined Japanese patent publication"), JP-A-63-178105 (the term "JP-A" as used herein means an "unexamined published Japanese patent application") and JP-A-2-244050, without any aid of a film original.

However, these conventional high-sensitive, photopolymerizable printing plates are not always strong in the adhesion between the photosensitive layer and the support, though it may depend on the conditions on use as the printing plate, and therefore, when a large number of sheets are printed at a high speed, there arise failures such that a solid image falls or a thin line drops out. In order to achieve strong adhesion between the photosensitive layer and the support, the roughened surface on the support surface may be rendered coarser and thereby the image can be surely improved in durability, however, in turn, the non-image area is reduced in hydrophilicity and as a result, scums are generated in printing. Further, when an undercoat layer such as a diazo resin is used to improve the adhesion between the photosensitive layer and the support, the diazo group photolyzes so that the process of the diazo group itself bonding to the support or the process of the diazo group itself bonding to the photosensitive layer difficultly proceeds, and moreover, a relatively large quantity of exposure amount is required, hence, this technique is not suitable for the system of making a printing plate directly by exposure to laser light.

Under these circumstances, attempts have been made to integrate a larger number of polymerizable functional groups into a sol-gel processing solution so that light adhesion can more efficiently proceed (see, for example, JP-A-7-159983), however, if too many polymerizable functional groups are integrated, hydrophilicity of the non-image area is impaired and a problem arises that scums are generated.

SUMMARY OF THE INVENTION

Accordingly, an object of the present invention is to provide a photosensitive PS plate, particularly, capable of laser writing, in which while a high-sensitive, photopolymerizable photosensitive layer is sensitized and polymerized, the photosensitive layer adheres to the support due to light to provide strong adhesion between the photosensitive layer and the support, and the non-image area has sufficiently high hydrophilicity.

Also in negative PS plates and positive PS plates of conventional type, insufficient hydrophilicity of the non-image area often gives rise to troubles in practical use and if the binder component in the photosensitive layer is changed so as to increase adhesion between the photosensitive layer and the support, scums may be generated in printing. Accordingly, another object of the present invention is to provide a photosensitive PS plate having a negative PS plate photosensitive layer or positive PS plate photosensitive layer of conventional type and imparted with sufficiently strong. adhesion between the photosensitive layer and the support and at the same time with sufficiently high hydrophilicity of the non-image area.

As a result of extensive investigations to achieve the above-described objects, the present inventors have found that these objects can be achieved by:

(1) a photosensitive lithographic printing plate comprising a substrate having provided on the surface thereof a photosensitive layer through a layer which is obtained by coating and drying a composition prepared by hydrolyzing and polycondensing a compound represented by formula (I) in a solvent having dissolved therein a phenol having a molecular weight of 1,000 or less or an organic phosphoric acid compound:

$$A_m M(R)_n \qquad (I)$$

wherein M represents silicon, aluminum, titanium or zirconium, A represents a hydrogen atom, an alkyl group, an aryl group, an alkenyl group, a propargyl group, an alkoxy group, an epoxyalkyl group, a silyl group, a siloxy group or a functional group capable of addition reaction by a radical, and R represents one of the following groups (a) to (e):

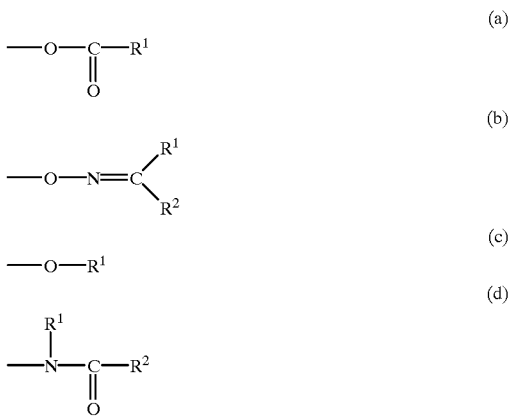

-continued

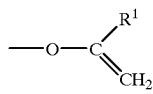
(e)

wherein $R^1$ and $R^2$, which may be the same or different, each represents an alkyl group, an alkenyl group or an aryl group, m and n each represents 0 or a positive integer, provided that m+n=3 or 4, when m is 2 or greater, the A groups may be the same or different, and when n is 2 or greater, the R groups may be the same or different; and (2) a photosensitive lithographic printing plate comprising a substrate having provided on the surface thereof a photopolymerizable photosensitive layer through a layer which is obtained by coating and drying a composition prepared by hydrolyzing and polycondensing a compound represented by the following formula (II) having a functional group capable of addition reaction by a radical in a solvent having dissolved therein a phenol having a molecular weight of 1,000 or less or an organic phosphoric acid compound:

(II)

wherein M represents silicon, aluminum, titanium or zirconium, A' represents a functional group capable of addition reaction by a radical, R represents one of the following groups (a) to (e):

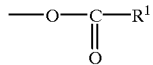
(a)

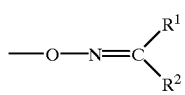
(b)

—O—$R^1$
(c)

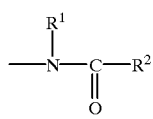
(d)

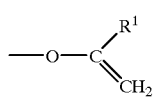
(e)

wherein $R^1$ and $R^2$, which may be the same or different, each represents an alkyl group, an alkenyl group or an aryl group, m and n each represents 0 or a positive integer, provided that m+n=3 or 4, when m is 2 or greater, the A' groups may be the same or different, and when n is 2 or greater, the R groups may be the same or different. The present invention has been accomplished based on this finding.

The phenol having a molecular weight of 1,000 or less or the organic phosphoric acid compound is removed from the non-image area of the support on alkali development to increase hydrophilicity of the area after removal. On the other hand, the organic functional group implanted in the support by a covalent bond well adheres to the photosensitive layer through organic-organic interaction, or the addition-reactive functional group implanted in the support by a covalent bond adheres to the photopolymerizable photosensitive layer due to light to provide strong adhesion between the photosensitive layer and the support and since the addition-reactive functional group is present in the non-image area at a density to such a degree as not causing any reduction in the hydrophilicity of the support, the non-image area maintains sufficiently high hydrophilicity.

By this technique, a larger number of polymerizable functional groups can be integrated into a sol-gel processing solution of which adhesive property and hydrophilicity has been difficult to control, so that light adhesion can proceed efficiently and at the same time, scums can be prevented without impairing the hydrophilicity of non-image area.

In particular, a photosensitive PS plate capable of laser writing can be suitably provided by the invention in item (2) above.

DETAILED DESCRIPTION OF THE INVENTION

The present invention is described in detail below.

In formulae (I) and (II), the metal M may be any of Si, Al, Ti and Zr, and of these, Al, Si and Ti are preferred in view of availability of the raw material.

In formulae (I) and (II), A and A' each represents a functional group covalently fixed to the processed surface and may be any if it is stably present in the form of formula (I) or (II). The chemical reactivity of the processed surface can be controlled by selecting the kind and the amount of A or A'.

Representative examples of A include hydrogen, a substituted or unsubstituted alkyl group, a substituted or unsubstituted aryl group, a substituted or unsubstituted alkenyl group, a substituted or unsubstituted propargyl group, a substituted or unsubstituted alkoxy group, a substituted or unsubstituted epoxyalkyl group, a substituted or unsubstituted silyl group, a substituted or unsubstituted siloxy group and a functional group capable of causing addition reaction by the radical reaction. These groups each may be substituted by one or a plurality of functional groups according to the purpose and examples thereof include a halogen group, an alkyl group, an aryl group, a hydroxyl group, an alkoxy group, an aryloxy group, an acyloxy group, a carbamoyloxy group, an alkoxycarbonyloxy group, an acyl group, an alkoxycarbonyl group, a carbamoyl group, a carboxy group, a propargyl group, an amino group, an alkylamino group, an acylamino group, a ureido group, a carbamate group, a diazonio group, a diazo group, an azo group, a mercapto group, an alkylthio group, a sulfonyl group, a sulfo group, a cyano group, a isocyanate group, a thioisocyanate group, a sulfamoyl group, a nitro group, a silyl group and a siloxy group. More specific examples of A are set forth below.

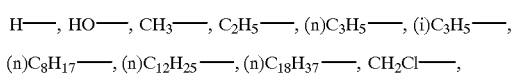

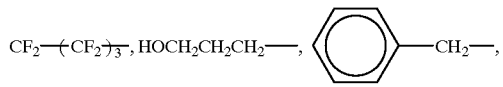

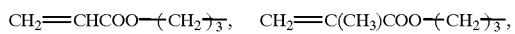

-continued

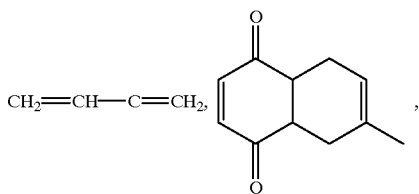

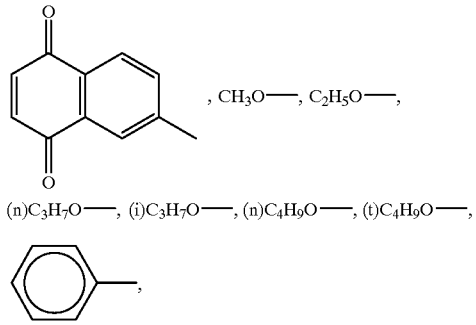

A' represents a functional group capable of causing addition reaction by a radical and among the above-described substituents represented by A, any may be used as long as it is a functional group capable of causing addition reaction by a radical. Specific preferred examples of the functional group represented by A' are set forth below.

$CH_2\!=\!CHCOO\!-\!(CH_2)_3\!-$, $CH_2\!=\!C(CH_3)COO\!-\!(CH_2)_3\!-$, $CH_2\!=\!CH\!-\!C(\!=\!CH_2)\!-$, $CH_2\!=\!CH\!-\!SO_2NH\!-\!(CH_2)_3\!-$,

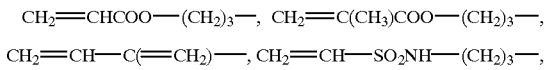

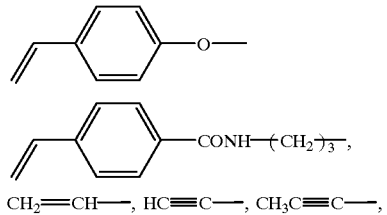

$CH_2\!=\!CH\!-$, $HC\!\equiv\!C\!-$, $CH_3C\!\equiv\!C\!-$,

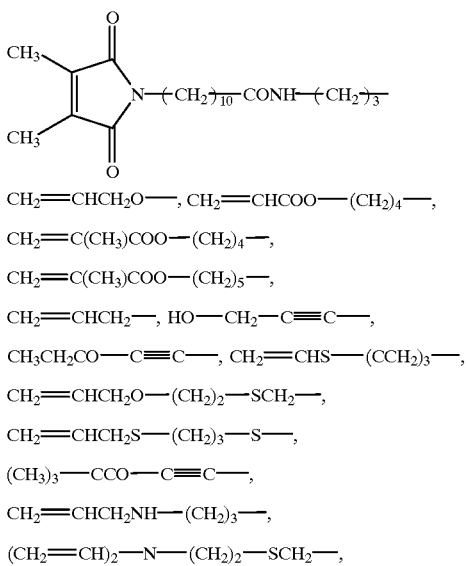

$CH_2\!=\!CHCH_2O\!-$, $CH_2\!=\!CHCOO\!-\!(CH_2)_4\!-$, $CH_2\!=\!C(CH_3)COO\!-\!(CH_2)_4\!-$, $CH_2\!=\!C(CH_3)COO\!-\!(CH_2)_5\!-$, $CH_2\!=\!CHCH_2\!-$, $HO\!-\!CH_2\!-\!C\!\equiv\!C\!-$, $CH_3CH_2CO\!-\!C\!\equiv\!C\!-$, $CH_2\!=\!CHS\!-\!(CCH_2)_3\!-$, $CH_2\!=\!CHCH_2O\!-\!(CH_2)_2\!-\!SCH_2\!-$, $CH_2\!=\!CHCH_2S\!-\!(CH_2)_3\!-\!S\!-$, $(CH_3)_3\!-\!CCO\!-\!C\!\equiv\!C\!-$, $CH_2\!=\!CHCH_2NH\!-\!(CH_2)_3\!-$, $(CH_2\!=\!CH)_2\!-\!N\!-\!(CH_2)_2\!-\!SCH_2\!-$, -continued

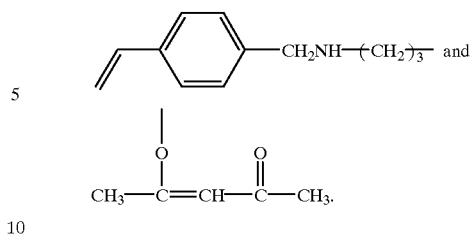

In formulae (a) to (e) representing R in formulae (I) and (II), $R^1$ and $R^2$ each represents a substituted or unsubstituted alkyl group (preferably having from 1 to 20, more preferably from 1 to 10 carbon atoms, e.g., methyl, ethyl, propyl, butyl), a substituted or unsubstituted alkenyl group (preferably having from 2 to 20, more preferably from 2 to 10 carbon atoms, e.g., vinyl, allyl) or a substituted or unsubstituted aryl group (preferably having from 6 to 20, more preferably from 6 to 10 carbon atoms, e.g., benzyl, naphthyl).

The group —R is not limited to a monodentate type but it may be a polydentate alkoxide such as diol or triol, or a polydentate organic acid residue such as oxalic acid or succinic acid.

Of the compounds represented by formulae (I) and (II), those where a part or all of $R^1$ and $R^2$ of formulas (a) to (e) are replaced by a halogen atom can be suitably used as the compound necessary for preparing the composition according to the present invention. More specifically, precursor compounds which can produce the compound represented by formula (I) or (II) by the action of water or alcohols all can be used. Representative examples of the halogen atom include F, Cl, Br and I.

Of the compounds represented by formulae (I) and (II), those where a part or all of $R^1$ and $R^2$ in formulas (a) to (e) undergo hydrolysis and polycondensation reaction to have a metal-oxygen-metal bond in the molecule, can also be used in the present invention.

Specific examples of the compounds represented by formulae (I) and (II) are set forth below.

$CH_2\!=\!CH\!-\!Si(OCOCH_3)_3$, $CH_2\!=\!CH\!-\!Si(OC_2H_5)_3$, $CH_2\!=\!CHSi(OCH_3)_3$, $CH_2\!=\!CHCH_2Si(OC_2H_5)_3$, $CH_2\!=\!CHCH_2NH(CH_2)_3Si(OCH_3)_3$, $CH_2\!=\!CHCOO\!-\!(CH_2)_3\!-\!Si(OCH_3)_3$, $CH_2\!=\!CHCOO\!-\!(CH_2)_3\!-\!Si(OC_2H_5)_3$, $CH_2\!=\!C(CH_3)COO\!-\!(CH_2)_3\!-\!Si(OCH_3)_3$, $CH_2\!=\!C(CH_3)COO\!-\!(CH_2)_3\!-\!Si(OC_2H_5)_3$, $CH_2\!=\!C(CH_3)COO\!-\!(CH_2)_4\!-\!Si(OCH_3)_3$, $CH_2\!=\!C(CH_3)COO\!-\!(CH_2)_5\!-\!Si(OCH_3)_3$, $CH_2\!=\!CHCOO\!-\!(CH_2)_4\!-\!Si(OCH_3)_3$, $Si(OCH_3)_4$, $Si(OC_2H_5)_4$, $Si(Oi\text{-}C_3H_7)_4$, $Si(OCOCH_3)_4$, $CH_3Si(OCH_3)_3$, $C_2H_5Si(OCH_3)_3$ $C_6H_5Si(OCH_3)_3$, $Al(Oi\text{-}C_3H_7)_3$, $Ti(OC_2H_5)_4$,

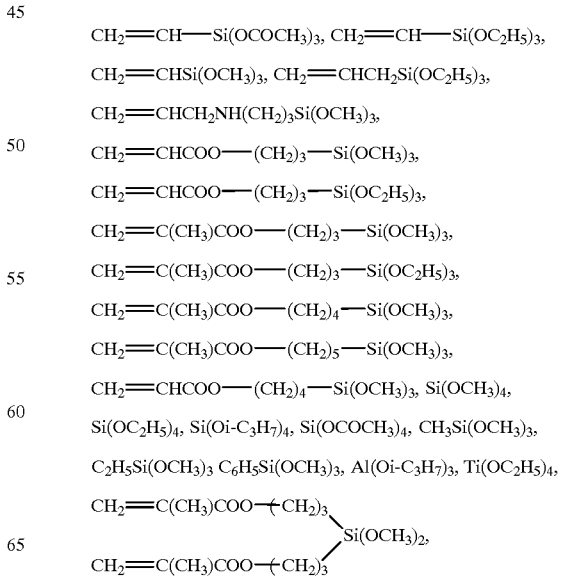

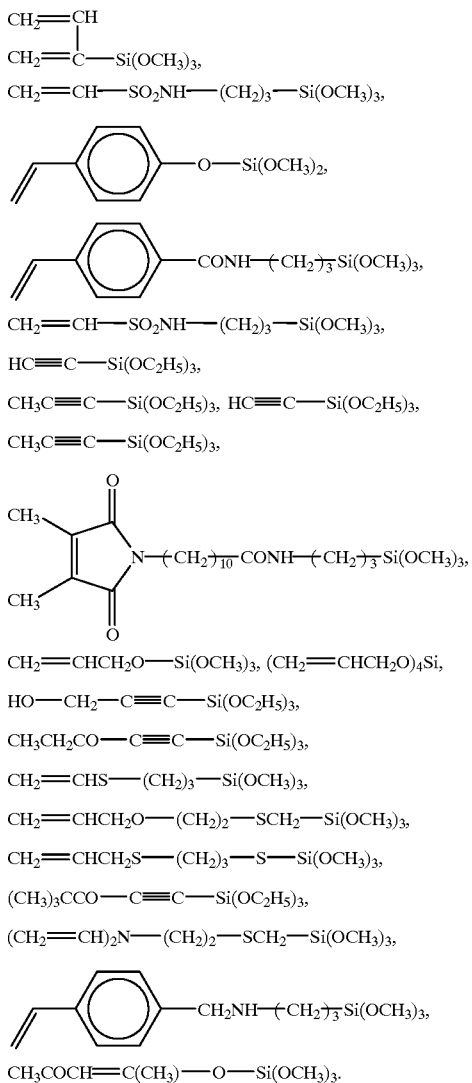

The phenols having a molecular weight of 1,000 or less and the organic acid compound according to the present invention are described below.

The phenol compound having a molecular weight of 1,000 or less, preferably approximately from 94 to 800, can be used in the present invention. Such a phenol compound can be easily synthesized by one skilled in the art according to the method. described, for example, in JP-A-4-122938, JP-A-2-28531, U.S. Pat. No. 4,916,210 and European Patent 219,294.

Specific examples of the phenol compound of the present invention are described below, however, the compound which can be used in the present invention is by no means limited thereto.

Phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene bisphenol, methylenebis-p-cresol, resorcinol, catechol, 2-methylresorcinol, 4-methylresorcinol, o-chlorophenol, m-chlorophenol, p-chlorophenol, 2,3-dichlorophenol, p-methoxyphenol, m-methoxyphenol, p-butoxyphenol, o-ethylphenol, m-ethylphenol, p-ethylphenol, 2,3-diethylphenol, 2,5-diethylphenol, p-isopropylphenol, p-t-butylphenol, pyrogallol, α-naphthol, β-naphthol, 2,3-dihydroxynaphthalene, 4-phenylphenol, phloroglycine, 2,3,4-trihydroxybenzophenone, 2,3,4,4'-tetrahydroxybenzophenone, 2,3,4,3',4',5'-hexahydroxybenzophenone, phloroglucoxide, 2,4,2',4'-biphenyltetrole, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl) methane, 1,1-bis(4-hydroxyphenyl)cyclohexane, 4,4-(α-methylbenzilidene) bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, para(α,α,α',α'-tetrakis(4-hydroxyphenyl)xylene, 2,4,4'-trihydroxybenzophenone, 2,4,6-trihydroxybenzophenone, 2,3,4-trihydroxy-2'-methylbenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4-trihydroxyacetophenone, 2,3,4-trihydroxyphenyl pentyl ketone, 2,3,4-trihydroxyphenyl hexyl ketone, bis(2,4-dihydoxyphenyl)methane, bis(2,3,4-trihydroxyphenyl)methane, bis(2,4-dihydroxyphenyl)propane-1, bis(2,3,4-trihydroxyphenyl) propane-1, propyl 3,4,5-trihydroxybenzoate, phenyl 2,3,4-trihydroxybenzoate, phenyl 3,4,5-trihydroxybenzoate, bis(2,3,4-trihydroxybenzoyl)methane, bis(3-acetyl-4,5,6-trihydroxyphenyl)methane, bis(2,3,4-trihydroxybenzoyl) benzene, bis(2,4,6-trihydroxybenzoyl)benzene, ethylene glycol-di(3,5-dihydroxybenzoate), ethylene glycol-di(3,4,5-trihydroxybenzoate), 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, 2,3,4,2',3',4'-biphenylhexol, 4,4'-thiobis(1,3-dihydroxy)benzene, 2,2',4,4'-diphenylsulfone, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane, 2,4,6,2',4',6'-hexahydroxy-5,5'-dipropionyltriphenylmethane, 3,3,3',3'-tetramethyl-1,1'-spirobiindane-5,6,5',6'-tetrole, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol, 3,3,3',3'-tetramethyl-1,1'-spirobiindane-4,5,6,5',6',7'-hexol, 3,3-bis(3,4-dihydroxyphenyl)phthalide, 3,3-bis(2,3,4-trihydroxyphenyl)phthalide, 3',4',5',6'-tetrahydroxyspiro (phthalide-3,9'-xanthene), furavone dyes such as morin, quercetin and rutine, polyhydroxy compounds described in JP-A-4-253058 such as α,α',α"-tris(3,5-dimethyl-4-hydroxyphenyl)-1,3,5-triisopropylbenzene, α,α',α"-tris(3,5-diethyl-4-hydroxyphenyl)-1,3,5-triisopropylbenzene, α,α',α"-tris(3,5-di-n-propyl-4-hydroxyphenyl)-1,3,5-triisopropylbenzene, α,α',α"-tris(3,5-diisopropyl-4-hydroxyphenyl)-1,3,5-triisopropylbenzene, α,α',α"-tris(3,5-di-n-butyl-4-hydroxyphenyl)-1,3,5-triisopropylbenzene, α,α',α"-tris(3-methyl-4-hydroxyphenyl)-1,3,5-triisopropylbenzene, α,α',α"-tris(3-methoxy-4-hydroxyphenyl)-1,3,5-triisopropylbenzene, α,α',α"-tris(2,4-dihydroxyphenyl)-1,3,5-triisopropylbenzene, 1,3,5-tris(3,5- dimethyl-4-hydroxyphenyl)benzene,1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4''-hydroxyphenyl)ethyl] benzene, 1-[α-methyl-α-(4'-hydroxyphenyl)ethyl]-3-[α,α'-bis(4''-hydroxyphenyl)ethyl]benzene, 1-[α-methyl-α-(3'',5'-dimethyl-4'-hydroxyphenyl)ethyl]-4-[α,α'-bis(3'',5'-dimethyl-4''-hydroxyphenyl)ethyl]benzene, 1-[α-methyl-α-(3'-methyl-4'-hydroxyphenyl)ethyl]-4-[α',α'-bis((3''-methyl-4''-hydroxyphenyl)ethyl]benzene, 1-[α-methyl-α-(3'-methoxy-4'-hydroxyphenyl)ethyl]-4-[α,α'-bis(3''-methoxy-4''-hydroxyphenyl)ethyl]benzene, 1-[α-methyl-α-(2',4'-dihydroxyphenyl)ethyl]-4-[α',α'-bis(4''-hydroxyphenyl)ethyl]benzene and 1-[α-methyl-α-(2',4'-dihydroxyphenyl)ethyl]-3-[α'',α'-bis(4''-hydroxyphenyl)ethyl]benzene, p-bis(2,3,4-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis(2'-hydroxy-3-t-butyl-5'-methylbenzyl)-p-cresol, 2,6-bis(2',3', 4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethylphenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)-1,3,4-trihydroxyphenol, 4,6-bis(2',4',6'-trihydroxybenzyl)-2,4-dimethylphenol and 4,6-bis(2',3',4'-trihydroxybenzyl)-2,5-dimethylphenol.

The organic phosphoric acid compound for use in the present invention is described below.

The organic phosphoric acid compound for use in the present invention is at least one compound selected from the group consisting of (1) a substituted or unsubstituted aliphatic or aromatic compound represented by formula (1): $R^3$—$(PO(OH)_2)_n$ (wherein n is 1 or 2) and (2) a substituted or unsubstituted aliphatic or aromatic compound represented by formula (2): $R^3$—$(PO(OH)(R^4))_n$ (wherein n is 1 or 2) (when n is 1, $R^3$ and $R^4$ each is a substituted or unsubstituted alkyl group (preferably having from 1 to 14 carbon atoms), an alkoxy group (preferably having from 1 to 14 carbon atoms), an aryloxy group (preferably having from 6 to 10 carbon atoms), an aryl group (preferably having from 6 to 10 carbon atoms), an acyl group (preferably having from 1 to 14 carbon atoms) or an acyloxy group (preferably having from 1 to 14 carbon atoms), and when n is 2, $R^3$ is an alkylene group (preferably having from 1 to 14 carbon atoms) or an arylene group (preferably having from 6 to 10 carbon atoms), and $R^4$ has the same meaning as defined above; the substituent is at least one selected from an alkyl group (limited to the substituent to the aryl residue), an aryl group (limited to the substituent to the alkyl residue), an alkoxy group, an acyl group, an acyloxy group, an aryloxy group, a vinyl group, a hydroxyl group, a carboxyl group, a cyano group, a nitro group and a halogen atom).

Examples of the aryloxy group include a phenoxy group, a p-chlorophenoxy group, a p-methylphenoxy group and a pyridinyl group, examples of the aryl group include a phenyl group, an o-tolyl group, an m-tolyl group, a p-tolyl group and a p-chlorophenyl group, examples of the acyl group include a formyl group, an acetyl group, a propionyl group and a benzoyl group, and examples of the acyloxy group include an acetoxy group, a propionyloxy group and a pivaloyloxy group. The compound represented by formula (1) or (2) may be used in the form of a salt. Examples of the salt include an alkali metal salt such as potassium, sodium and lithium, and a salt such as calcium, cobalt, iron, nickel, manganese, magnesium, barium and copper.

Specific examples of the compounds are described below.

Examples of the compound represented by formula (1) include phenylphosphonic acid, phenylphosphoric acid, naphthylphosphonic acid, naphthylphosphoric acid, glycerophosphonic acid, glycerophosphoric acid, p-nitrophenylphosphonic acid, p-nitrophenylphosphoric acid, p-methoxyphenylphosphonic acid, p-methoxyphenylphosphoric acid, p-hydroxyphenylphosphonic acid, p-hydroxyphenylphosphoric acid, p-tolylphosphonic acid, p-tolylphosphoric acid, p-acetylphenylphosphonic acid, p-acetylphenylphosphoric acid, p-cyanophenylphosphonic acid, p-cyanophenylphosphoric acid, m-chlorophenylphosphonic acid, m-chlorophenylphosphoric acid, methylphosphonic acid, ethylphosphonic acid, 2-carboxyethylphosphonic acid, phosphonoacetic acid, 2-phenylethylphosphonic acid, 2-hydroxyethylphosphonic acid, 1-hydroxyethane-1,1-diphosphonic acid, aminohexylphosphoric acid, 2-methoxyethylphosphonic acid, 2-acetylethylphosphonic acid, phosphoserine, phosphothreonine, pyridoxal phosphate, diphosphonomethane, 1,2-diphosphonoethane, 1,3-diphosphonopropane, 1,4-diphosphonobutane, 1,5-diphosphonopentane, 1,6-diphosphonohexane, 1,7-diphosphonoheptane, 1,8-diphosphonooctane, 1,9-diphosphononoane, 1,10-diphosphonodecane, 1,11-diphosphonoundecane, 1,12-diphosphonoundecane, o-phenylenediphosphonic acid, m-phenylenediphosphonic acid, p-phenylenediphosphonic acid, 4,4'-biphenylenediphosphonic acid, o-xylylenediphosphonic acid, m-xylylenediphosphonic acid and p-xylylenediphosphonic acid.

Examples of the compound represented by formula (2) include phenylphosphinic acid, naphthylphosphinic acid, diphenylphosphinic acid, dimethylphosphinic acid, p-nitrophenylphosphinic acid, p-methoxyphenylphosphinic acid, p-hydroxyphenylphosphinic acid, p-tolylphosphinic acid, p-acetylphenylphosphinic acid, bisnitrophenylphosphoric acid, dioctyl phosphate, diisopropyl phosphate, dibutyl phosphate, dimethyl phosphate, diethyl phosphate, di-2-ethylhexyl phosphate, diphenyl phosphate, methylphosphinic acid, ethylphosphinic acid, diethylphosphinic acid, 2-carboxyethylphosphinic acid, 2-phenylethylphosphinic acid, 2-hydroxyethylphosphinic acid, 2-methoxyethylphosphinic acid and 2-acetylethylphosphinic acid.

Further, the compound represented by the following formula (3) may also be used as the organic phosphoric acid compound for use in the present invention:

(3)

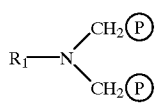

(P) represents —PO$_3$H$_2$, —OPO$_3$H$_2$ or a salt thereof;

R$_1$ represents an organic residue which may have a substituent, and more specifically has the same meaning as R$^3$ and R$^4$ in formula (2).

Specific examples of the compound are set forth below, however, the present invention is by no means limited thereto.

In the following specific examples, 2EH indicates a 2-ethylhexyl group having the formula:

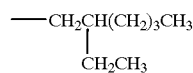

and nOct indicates an n-octyl group having the formula: n-C$_8$H$_{17}$.

1.

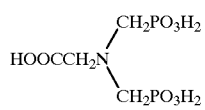

2.

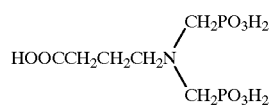

3.

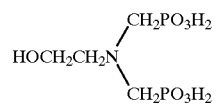

4.

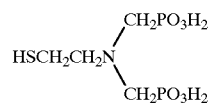

5.

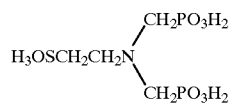

6.

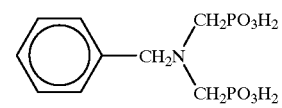

7.

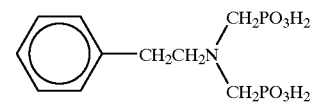

8.

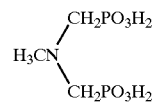

9.

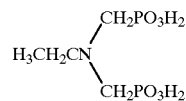

10.

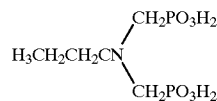

-continued
11. 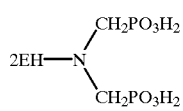
12. 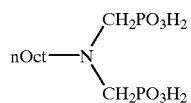
13. 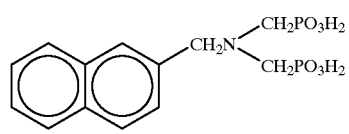
14. 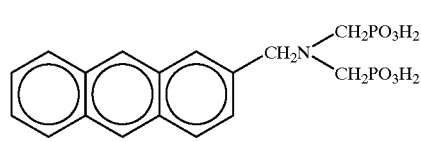
15. 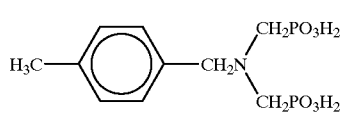
16. 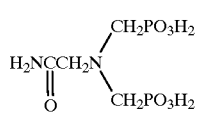
17. 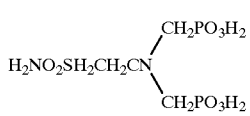
18. 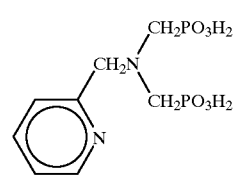
19. 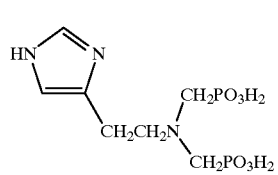
20. 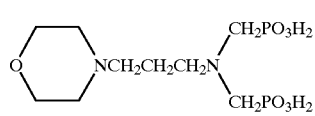
21. 
22.

23.
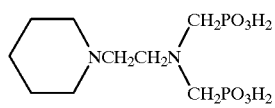
24.
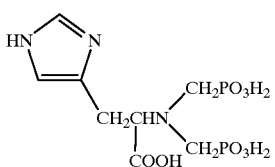
25.
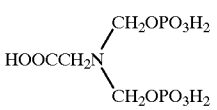
26.
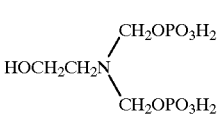
27.
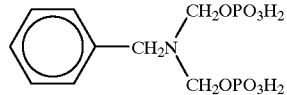
28.
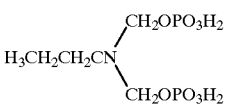
29.
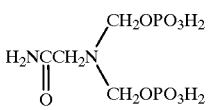
30.
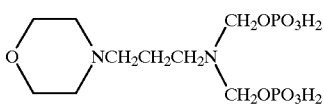
31.
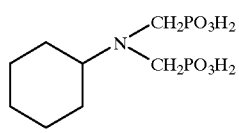
32.
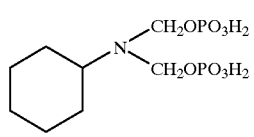
33.
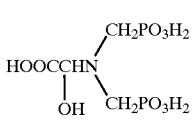
34.
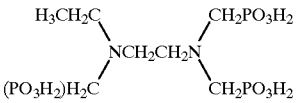

-continued
35. 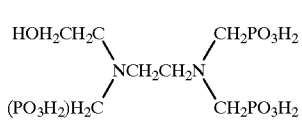
36. 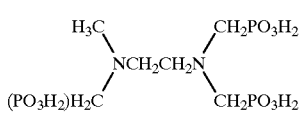
37. 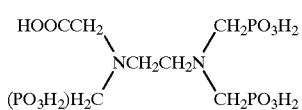
38. 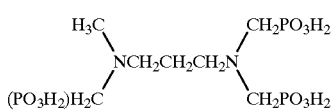
39. 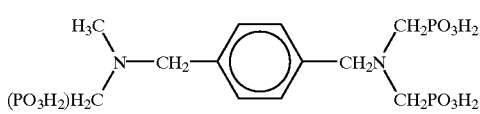
40. 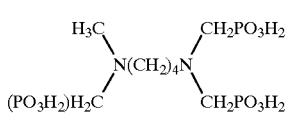
41. 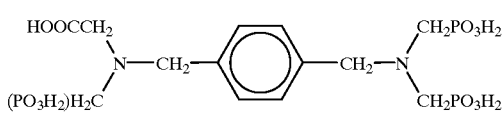
42. 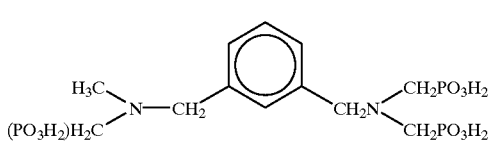
43. 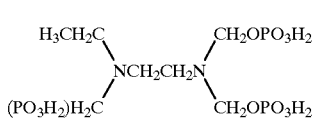
44. 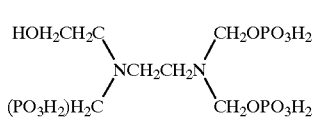
45. 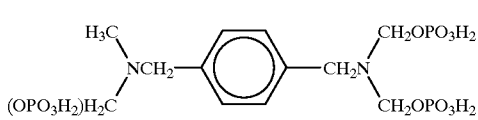
46. 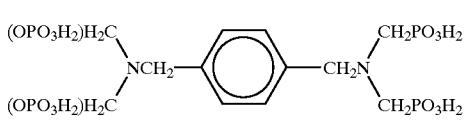
47. 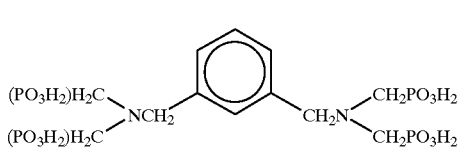

-continued
48.
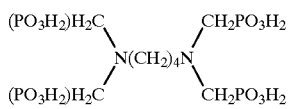
49.
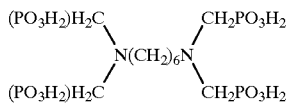
50.
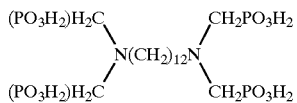
51.
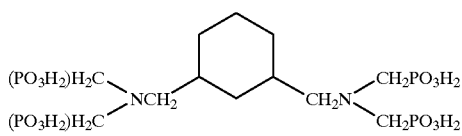
52.
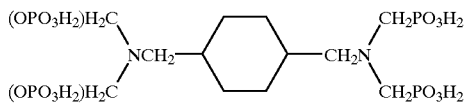
53.
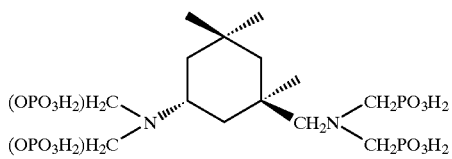
54.
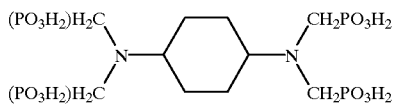
55.
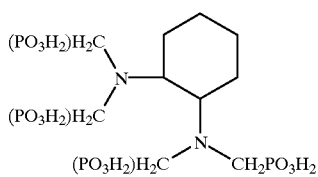
56.
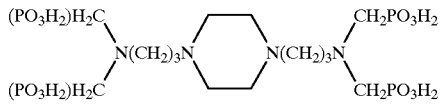
57.
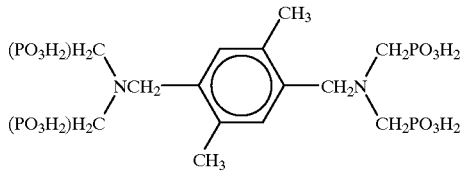
58.

-continued
59.
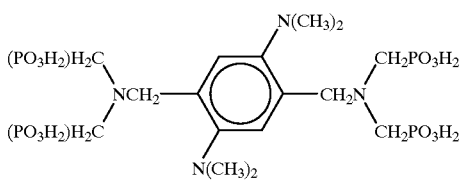
60.
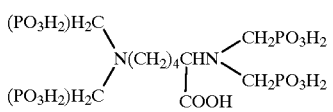
61.
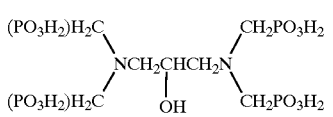
62.
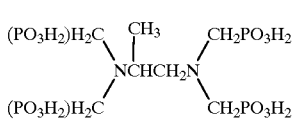
63.
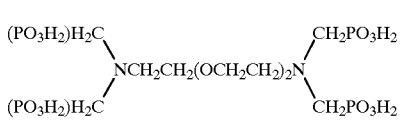
64.
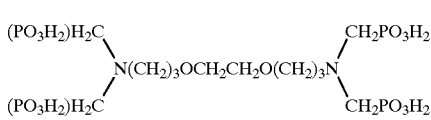
65.
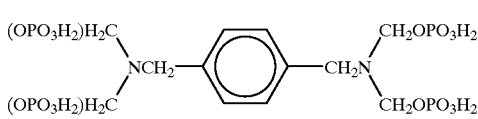
66.
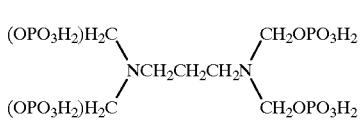
67.
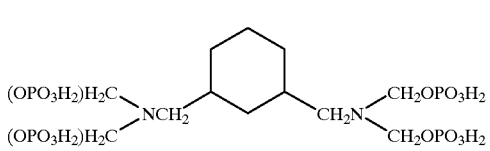
68.
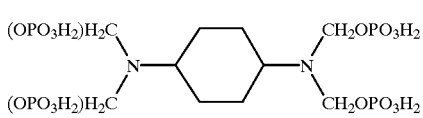
69.
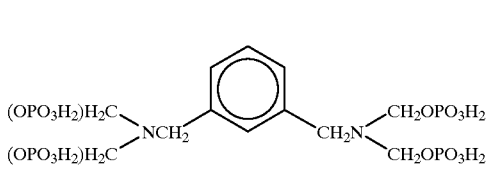
70.
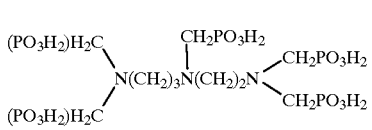

-continued
71.
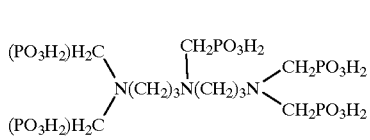
72.
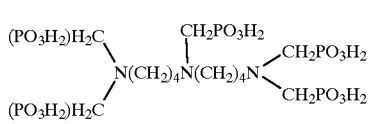
73.
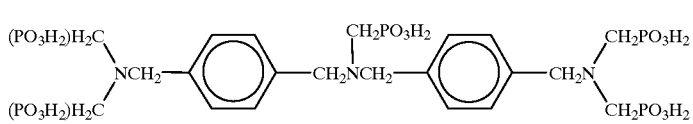
74.
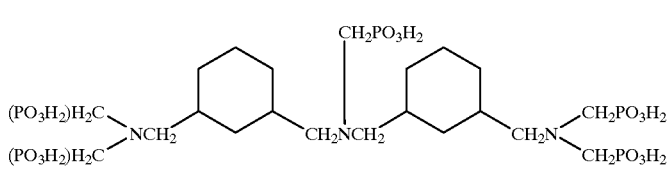
75.
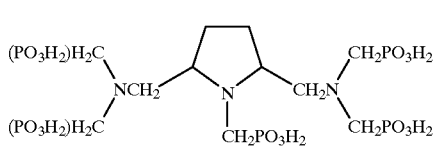
76.
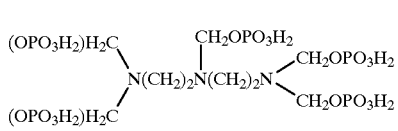
77.
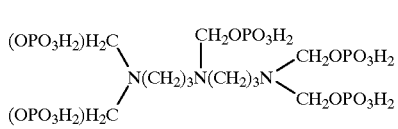
78.
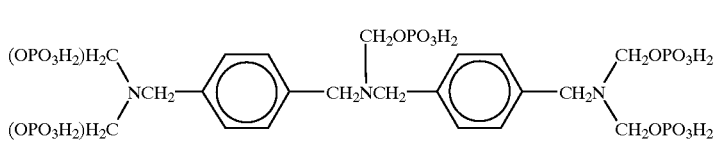
79.
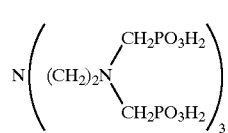
80.
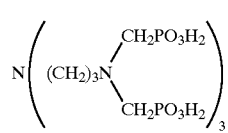
81.
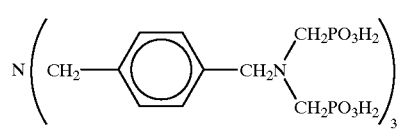

82.
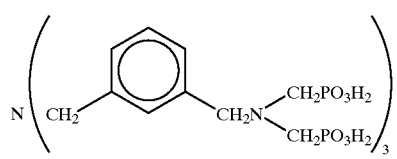
83.
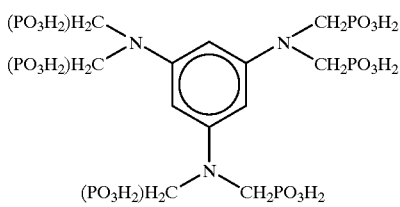
84.
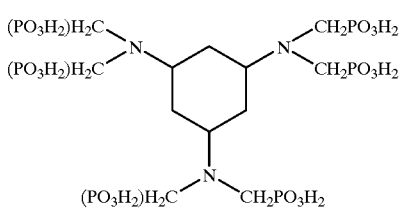
85.
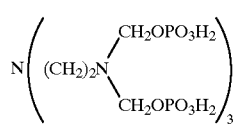
86.
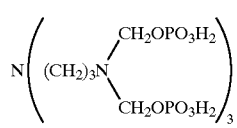
87.
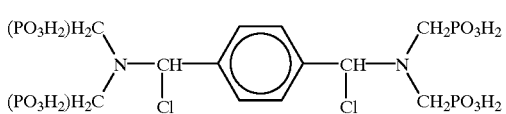
88.
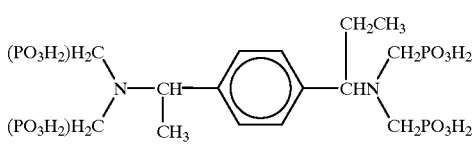
89.
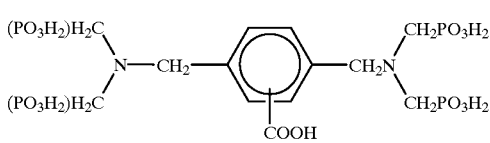
90.
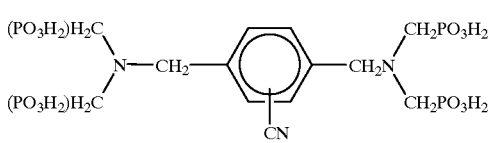
91.
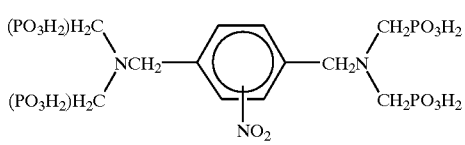

-continued

92.

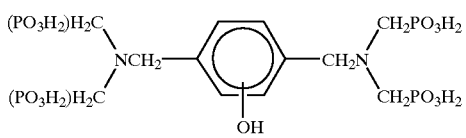

93.

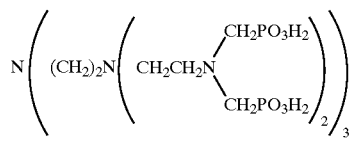

94.

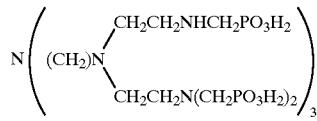

The organic phosphoric acid compound for use in the present invention can be synthesized by the addition reaction of a phosphonic acid to a Schiff's base, the dehydration condensation reaction of an alcohol with an orthophosphoric acid or the condensation reaction of an alcohol with a phosphorus oxychloride, described in SYNTHESIS, 81–96 (1976) and Jikken Kagaku Koza (Lecture of Experimental Chemistry) 19, Maruzene (1957).

Examples of the organic solvent used in dissolving a phenol having a molecular weight of 1,000 or less or an organic phosphoric acid compound for use in the present invention and subjecting the compound represented by formula (I) or (II) to hydrolysis and polycondensation, include the followings:

Methanol, ethanol, n-propanol, i-propanol, 1-butanol, 2-butanol, isobutyl alcohol, amyl alcohol, pentanol, fusel oil, hexanol, heptanol, octanol, cyclohexanol, benzyl alcohol, furfuryl alcohol, tetrahydrofurfuryl alcohol, hexane, heptane, octane, decane, petroleum ether, petroleum benzine, ligroin, gasoline, kerosene, cyclohexane, benzene, toluene, o-xylene, m-xylene, p-xylene, styrene, cresol, tetralin, decalin, turpentine oil, chloroform, carbon tetrachloride, methylene chloride, ethylene chloride, ethylidene chloride, trichloroethane, tetrachloroethane, trichloroethylene, tetrachloroethylene, trichloropropane, isopropyl chloride, dichloropropane, butyl chloride amyl chloride, hexyl chloride, ethylene bromide, tetrabromoethane, chlorobenzene, o-dichlorobenzene, trichlorobenzene, bromobenzene, chlorotoluene, diethyl ether, isopropyl ether, dibutyl ether, diisoamyl ether, hexyl ether, methyl phenyl ether, ethyl phenyl ether, butyl phenyl ether, ethyl benzyl ether, 1,4-dioxane, 2-methylfuran, tetrahydrofuran, tetrahydropyran, 2-ethoxytetrahydropyran, cineole, acetone, methyl ethyl ketone, methyl propyl ketone, methyl butyl ketone, methyl isobutyl ketone, methyl amyl ketone, methyl hexyl ketone, diethyl ketone, ethyl butyl ketone, dipropyl ketone, diisobutyl ketone, diacetone alcohol, phorone, isophorone, cyclohexanone, methylcyclohexanone, acetophenone, ethyl formate, propyl formate, butyl formate, isobutyl formate, amyl formate, methyl acetate, ethyl acetate, propyl acetate, isopropyl acetate, butyl acetate, isobutyl acetate, secondary butyl acetate, amyl acetate, isoamyl acetate, methylisoamyl acetate, methoxybutyl acetate, 2-ethylbutyl acetate, hexyl acetate, cyclohexyl acetate, benzyl acetate, methyl propionate, ethyl propionate, butyl propionate, amyl propionate, methyl butyrate, ethyl butyrate, butyl butyrate, amyl butyrate, isoamyl butyrate, methyl acetoacetate, ethyl acetone acetate, isoamyl isovelerate, methyl lactate, ethyl lactate, butyl lactate, amyl lactate, methyl benzoate, diethyl oxalate, ethylene glycol, ethylene glycol monomethyl ether, ethylene glycol monomethyl ether acetate, ethylene glycol dimethyl ether, ethylene glycol monoethyl ether, ethylene glycol diethyl ether, ethylene glycol monoethyl ether acetate, ethylene glycol isopropyl ether, ethylene glycol monobutyl ether, ethylene glycol monoisobutyl ether, ethylene glycol dibutyl ether, ethylene glycol monobutyl ether acetate, ethylene glycol isoamyl ether, ethylene glycol monohexyl ether, ethylene glycol monophenyl ether, ethylene glycol monophenyl ether acetate, ethylene glycol benzyl ether, methoxymethoxyethanol, ethylene glycol monoacetate, ethylene glycol diacetate, ethylene glycol butyric monoester, ethylene glycol propionic diester, ethylene glycol butyric diester, diethylene glycol, diethylene glycol monomethyl ether, diethylene glycol monoethyl ether, diethylene glycol monomethyl ether acetate, diethylene glycol monoethyl ether acetate, diethylene glycol monoisopropyl ether, diethylene glycol monobutyl ether, diethylene glycol monoisobutyl ether, diethylene glycol monobutyl ether acetate, diethylene glycol dimethyl ether, diethylene glycol diethyl ether, diethylene glycol methyl ethyl ether, diethylene glycol acetate, diethylene glycol dibutyl ether, propylene glycol, propylene glycol monomethyl ether, propylene glycol monoethyl ether, propylene glycol monomethyl ether acetate, propylene glycol propyl ether, propylene glycol monoethyl ether acetate, propylene glycol monobutyl ether, dipropylene glycol, dipropylene glycol monomethyl ether, dipropylene glycol monoethyl ether, dipropylene glycol dimethyl ether, dipropylene glycol methyl ethyl ether, dipropylene glycol diethyl ether, trimethylene glycol, triethylene glycol dimethyl ether, butanediol, pentanediol, hexylene glycol, 3-methoxy-3-methoxybutanol, formic acid, acetic acid, acetic anhydride, propionic acid, propionic anhydride, butyric acid, valeric acid, lactic acid, pyridine, picoline, quinoline, isoquinoline, dimethyl sulfoxide, triethyl phosphate, γ-butyrolactone, γ-valerolactone, 6-hexanolactone, methyl salicylate, ethyl salicylate, butyl salicylate, diethyl adipate, ethyl carbonate, butyl sulfide, acetylacetone, monoethanolamine, diethanolamine, triethanolamine, N,N-dimethylformamide and glycerin.

Among these, preferred are methanol, ethanol, i-propanol, hexane, cyclohexane, benzene, toluene, 1,4-dioxane, tetrahydrofurane, methyl ethyl ketone, ethylene glycol dimethyl ether, ethylene glycol monomethyl ether, ethylene glycol diethyl ether, propylene glycol monomethyl ether, acetyl acetone, N,N-dimethylformamide and monoethanolamine.

These organic solvents may be used either individually or in combination of two or more thereof.

When the phenol or organic phosphoric acid compound for use in the present invention is not dissolved in the above-described organic compound, it is dissolved in 1,4-dioxane, acetone, methyl ethyl ketone, ethylene glycol monomethyl ether, ethylene glycol monomethyl ether acetate, diethylene glycol, dimethyl sulfoxide, N,N-dimethylformamide or acetylacetone before mixing with the above-described organic solvent.

The phenol or organic phosphoric acid compound is used suitably in an amount of from 1/10 to 1/200 times in mol based on the molar number of the compound represented by formula (I) or (II).

In the case where the compound represented by formula (I) or (II) is hydrolyzed in an organic solvent, water remaining and contained in the organic solvent may be used as a hydrolyzing agent as it is, however, in order to complete the preparation of the liquid composition according to the present invention within a predetermined time, water is preferably added generally in an amount of from 0.5 to 1,000 mol per mol of the compound of formula (I) or (II). If the amount of water is less than this range, hydrolysis and subsequent polycondensation reaction proceed very slowly and several days may be required to reach the state where metal surface treatment can be performed. On the other hand, if the amount of water exceeds the above-described range, the composition produced may fail, even when coated on the metal surface, in adhering to the surface and moreover, the composition is bad in the aging stability and readily undergoes gelling, whereby stable operation is difficultly achieved in coating the composition.

Water works as the reaction substance for the hydrolysis and additionally, may play a role as the solvent in the processing solution of the present invention. Under the conditions such that the compound represented by formula (I) or (II) is hydrolyzed at a low speed and not easily gelled, the liquid composition according to the present invention can be prepared in an aqueous medium.

The reaction temperature is usually from room temperature to about 100° C., however, by installing a reflux condenser, the reaction may be performed at a temperature higher than the boiling point of the solvent.

The reaction temperature determines the time necessary for the hydrolysis and the polycondensation reaction. Since the reaction which takes several days at room temperature completes within several hours at 80° C., the reaction temperature is appropriately determined depending on the purpose.

Examples of the catalyst, which is used if desired, include an acid such as hydrochloric acid, sulfuric acid, phosphoric acid or acetic acid, or a base such as ammonia or tetramethylammonium hydroxide. The catalyst is added in an amount of approximately from 0.01 to 0.1 mol per mol of the compound represented by formula (I) or (II). In some cases, the catalyst is suitably added in an amount of 0.1 mol or more, however, the addition amount is suitably at most 1 mol so that waste of the catalyst can be avoided.

The catalyst may be added by a method of adding the catalyst itself as a simple substance or by a method of adding a catalyst solution. For example, in place of adding hydrochloric acid as it is, an anhydrous methanol solution of hydrochloric acid may be added. Further, tetramethylammonium. hydroxide may also be used, for example, as an aqueous solution or ethanol solution thereof.

When a composition comprising one or more compounds represented by formula (I) or (II), an organic solvent, water and if desired, a catalyst is reacted by selecting an appropriate reaction temperature, an appropriate reaction time and if desired, an appropriate stirring condition, hydrolysis and polycondensation reaction are caused to produce a polymer or colloidal polymer having a metal-oxygen-metal bond and thereby the liquid composition increases in the viscosity and becomes a sol.

The thus-obtained sol is polymerized to form a gel and the gel is heated at from 400 to 1,000° C. to produce a glass. This method is well known as the sol-gel method.

It is also well known that if the glass production reaction is performed on a separate substrate, an oxide film can be provided.

In the method according to the present invention, 1) an inorganic polymer comprising a metal-oxygen-metal bond, present in the above-described sol is bonded to the surface of a metal to be treated, to thereby implant an organic reactive group covalently fixed to the inorganic polymer, onto the metal surface to be treated; 2) one or a plurality of groups of the phenol compound or organic phosphoric acid compound coordinate or bond to the site bonded by oxygen in the above-described inorganic polymer to thereby inhibit crosslinking of the liquid composition provided on the metal surface to be treated or crosslinking of the sol after coating; and 3) the compound is eluted out from the non-image area on development so that crosslinkability of the sol-gel can be controlled. Thus, it is not an object to permanently provide the phenol compound or organic phosphoric acid compound on the metal surface. This relationship may be schematically shown as follows, where silicon and catechol as one example of the phenol compound are used.

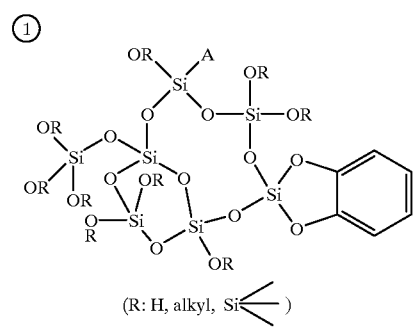

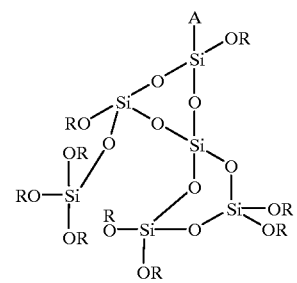

(R: H, alkyl, Si≦ )

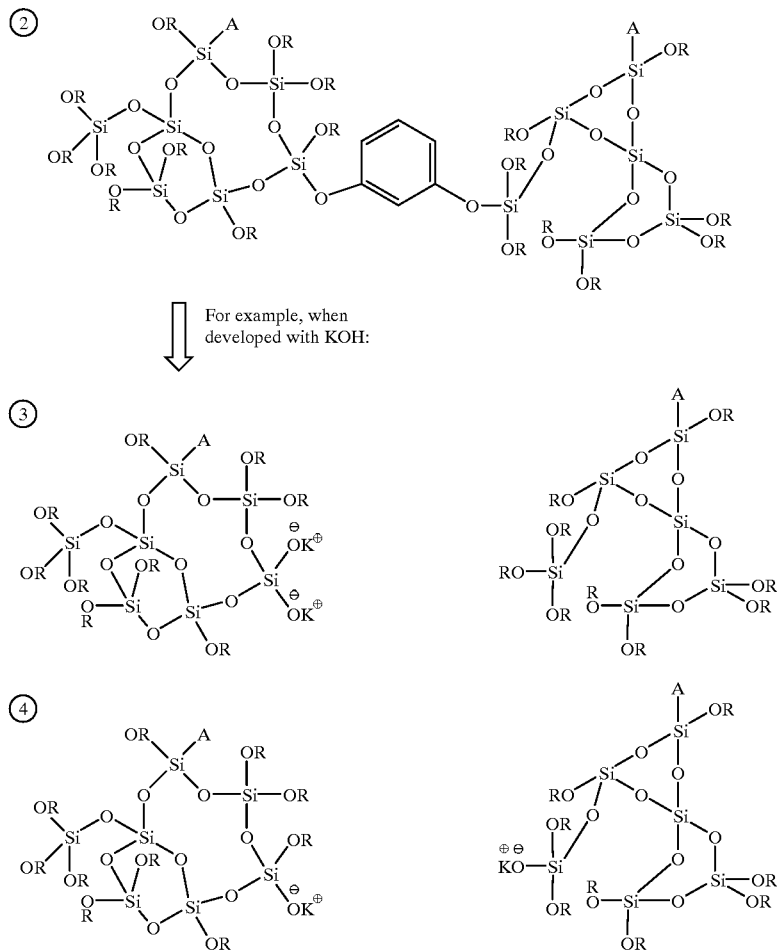

When the sol solution or liquid composition for use in the present invention is air dried or dried by heating after the coating on the support surface, the inorganic polymer comprising a metal-oxygen-metal bond is gelled and at the same time, covalently bonded to the support surface. The drying is performed for volatilizing, the solvent, the residual water, and if used, the catalyst, however, the drying step may be omitted depending on the use of the support after the treatment. In order to increase adhesion between the inorganic polymer moiety in the liquid composition according to the present invention and the metal surface to be treated, heating may be aggressively applied. In this case, the drying process may be continued after volatilization of the solvent, water or the like. In the drying and in the heating continued thereafter, the maximum temperature is preferably in the range where the functional group (A in formula (I)) implanted on the metal surface does not decompose. Accordingly, the drying temperature condition which can be used is from room temperature to 200° C., preferably from room temperature to 150° C., more preferably from room temperature to 120° C. The drying time is generally from 30 seconds to 30 minutes, preferably from 45 seconds to 10 minutes, more preferably from 1 to 3 minutes. The liquid composition (the organic silicone compound or a solution or sol solution thereof) may be applied by using various methods such as brush coating, dip coating, atomizing, spin coating and doctor blade-coating, and the method is selected by taking account of the shape of the support surface or the necessary thickness of the film processed. The coverage of the liquid composition is generally from 0.1 to 50 mg/m$^2$, preferably from 0.5 to 20 mg/m$^2$, more preferably from 1 to 10 mg/m$^2$ in terms of the Si element amount measured by means of a fluorescent X-ray analyzer. In the case when the support is a metal sheet, the metal surface on treating is preferably a clean surface free from attachment of oily matters or the like, however, excluding the case where the surface is outstandingly stained by oily matters attached thereto, the metal surface may be used as it is. If desired, the metal surface may be roughened by having unevenness mechanically imposed or by electrolytic deposition or electrolytic etching. A metal on which surface a natural oxidation film is produced or a metal of which surface is aggressively oxidized by anodization or catalytic oxidation may also be suitably used. A method on which surface an oxide film different in the kind from the ground metal is provided by flame spraying, coating or CVD, may be of course used. Not only the oxide but also, for example, a metal on which surface a surface layer different in the kind from the metal surface is provided by surface silicate treatment or surface nitriding, may also be used.

The support used is a sheet material having sufficiently high strength to endure working in a printing machine. Examples of the support include metal sheet, polyester sheet, polyimide sheet and reinforced paper. For the purpose of obtaining a printing plate for use in printing a large number of sheets at a high speed, a metal sheet is preferably used as the substrate and in particular, an aluminum plate degreased by a usual method is preferred. The aluminum plate for use in the present invention is a pure aluminum plate or a plate of aluminum alloy comprising aluminum as a main component and a trace amount of different atoms. Examples of the different atom include silicon, iron, manganese, copper, magnesium, chromium, zinc, bismuth, nickel and titanium. The alloy composition has a different atom content of 10 wt % or less. The aluminum preferred in the present invention is pure aluminum, however, completely pure aluminum is difficult to produce in view of smelting technology and therefore, aluminum free from the different atoms as much as possible is preferred. Further, the aluminum alloy having the above-described content of different atoms is included in the material which can be used in the present invention. This, the aluminum plate for use in the present invention is not particularly limited in the composition and conventionally known and commonly used materials may be appropriately used. Examples of preferred materials include JIS A 1050, JIS A 1100, JIS A 1200, JIS A 3003, JIS A 3103 and JIS A 3005. The thickness of the aluminum plate for use in the present invention is approximately from 0.1 to 0.5 mm.

The aluminum plate is, if desired, subjected to treatment, for example, with a surface active agent or an alkaline aqueous solution such as degreasing, graining, anodization or hydrophilizing treatment. The graining treatment includes a method of mechanically roughening the surface, a method of electrochemically dissolving the surface and a method of chemically selectively dissolving the surface. The mechanical surface roughening method may use a known method such as a ball polishing method, a brush polishing method, a blast polishing method or a buff polishing method. The electrochemical roughening method includes a method of roughening the surface by subjecting it to electrolysis with an alternating current or direct current in a hydrochloric acid or nitric acid electrolyte. Further, a method of combining these two methods may be used as disclosed in JP-A-54-63902. The aluminum plate roughened as described above is, if desired, subjected to etching treatment and neutralization treatment.

The electrolyte for use in the anodization treatment of the aluminum plate may be any if it can form a porous oxidation film. In general, sulfuric acid, phosphoric acid, oxalic acid, chromic acid or a mixed acid thereof is used and the concentration of such an electrolyte is appropriately determined according to the kind of electrolyte. The treatment conditions in anodization varies depending on the electrolyte used and cannot be definitely specified, however, generally, the conditions are suitably such that the concentration of electrolyte is from 1 to 80 wt %, the solution temperature is from 5 to 70° C., the current density is from 5 to 60 A/dm$^2$, the voltage is from 1 to 100 V, the electrolysis time is from 10 seconds to 50 minutes. Among these anodization treatments, the method of performing anodization at a high current density in a sulfuric acid described in British Patent 1,412,768 and the method of performing anodization in sulfuric acid having a low concentration described in U.S. Pat. No. 4,211,619 are preferred. Most preferred is a method of performing anodization in an electrolyte containing from 5 to 20 wt % of sulfuric acid and from 3 to 15 wt % of aluminum ion at a temperature of from 25 to 50° C. with a direct current having a current density of from 5 to 20 A/dm$^2$. The coverage of the anodized film to be formed is generally from 0.1 to 10 g/m$^2$.

The hydrophilizing treatment preferably includes the processing with an aqueous solution of an alkali metal silicate and the processing with an aqueous solution of organic phosphonic acid. The aluminum plate is dipped in an aqueous solution containing an alkali metal silicate in an amount of from 1 to 30 wt %, preferably from 2 to 15 wt %, and having a pH at 25° C. of from 10 to 13, for example, at from 15 to 80° C. for from 0.5 to 120 seconds. Examples of the alkali metal silicate for use in the present invention include sodium silicate, potassium silicate and lithium silicate. Examples of the hydroxide which is used in order to elevate the pH of the aqueous solution of alkali metal silicate, include sodium hydroxide, potassium hydroxide and lithium hydroxide. In the above-described processing solution, an alkaline earth metal salt or Group IVB metal salt may be blended. Examples of the alkaline earth metal salt include a nitrate such as calcium nitrate, strontium nitrate, magnesium nitrate and barium nitrate, and a water-soluble salt such as sulfate, hydrochloride, phosphate, acetate, oxalate and borate. Examples of the Group IVB metal salt include titanium tetrachloride, titanium trichloride, potassium titanium fluoride, potassium titanium oxalate, titanium sulfate, titanium tetraiodide, zirconium chloride oxide, zirconium dioxide, zirconium oxychloride and zirconium tetrachloride. The alkaline earth metal salt or the Group IVB metal salt may be used individually or in combination of two or more thereof. The metal salt is preferably used in an amount of from 0.01 to 10 wt %, more preferably from 0.05 to 5.0 wt %.

The amount of addition-reactive functional groups on the support varies depending on the addition-reactive functional group bonded, however, the suitable number of the groups is generally from 0.01 to 400, preferably from 0.05 to 40, more preferably from 0.1 to 5 per 100 Å$^2$. If the amount of the addition-reactive functional groups is less than 0.01 groups per 100 Å$^2$, sufficiently high light-adhesion strength can be difficultly obtained. The amount of addition-reactive functional groups per 100 Å$^2$ can be substantially increased to any large number by thickly and repeatedly coating the sol solution or liquid composition according to the present invention, however, since the amount of addition-reactive functional groups appearing on the outermost surface per 100 Å$^2$ is at most 10 groups, excessively thick coating is useless. In order to avoid lack of hydrophilicity on the non-image area of the plate used as a PS plate due to the excessive amount of the addition-reactive functional groups, the amount of addition-reactive functional groups per 100 Å$^2$ is preferably 400 groups or less.

The amount of addition-reactive functional groups held on the support surface can be determined by measuring the treated support surface by an appropriate method such as the fluorescent X-ray analysis method or the infrared absorption method, and analyzing quantitatively the amount of Si atoms and the amount of carbon-carbon multiple bonds present on the surface. In constituting a PS plate using a support having bonded thereto addition-reactive functional groups (hereinafter referred to as an "addition-reactive support"), if the support is merely treated with a sol solution prepared using only the organic silicon compound represented by formula (II), printing scums may be generated. More specifically, when a photosensitive layer is provided on a support bonded with addition-reactive functional groups by coating, generally, a photopolymerizable photosensitive composition and imagewise exposed to cause interface light adhesion along the image, and the unexposed area is removed by a developer, a photopolymerization adhesion film remains on the support according to the pattern of light. Then, when ink and water are coated thereon, ink and water adhere to the imagewise exposed area having the polymerization adhesion film and to the unexposed area, respectively. If this is used as a printing plate and when the above-described organic silicone compound is used as a sole raw material, ink in addition to water adheres to the unexposed area to which water should adhere, because excessive organic functional groups are liable to appear there, and the ink may be observed as scums on the printed matter. Accordingly, in order to prevent the printing scums, a large number of OH groups in addition to the addition-reactive functional groups (A') are preferably fixed onto the support surface to intensify the hydrophilicity. It is preferred, in preparing a sol solution, to use an organic silicone compound (5) represented by formula (5): $Si(OR_4)_4$ (wherein —$OR_4$ represents a hydrolyzable alkoxy group, an alkoxyalkoxy group, an aryloxy group or —$OCOCH_3$) in combination with the organic silicone compound represented by formula (II), and bond, to the support surface, a reaction site represented by formula (4):

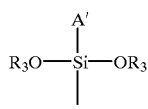

(4)

and at the same time, a hydrophilic site represented by formula (6):

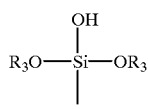

(6)

wherein $R_3$ represents an alkyl group, a hydrogen atom or a bond to other Si atom adjacent thereto. $R_3$ is most preferably a hydrogen atom in view of hydrophilicity. When $R_3$ is other than a hydrogen atom, the surface may be washed with an alkali solution, if desired, to thereby increase the hydrophilicity.

The addition-reactive functional group may be suitably bonded to the support surface by the above-described method which comprises hydrolyzing and polycondensing the organic silicone compound and using the resulting organic-inorganic composite material in which the addition-reactive functional group is fixed to an inorganic polymer having an —Si—O—Si— bond (hereinafter referred to as an "SG method"). When this organic-inorganic composite material is coated on a support and dried, in the case where the support is a metal or an oxide thereof, the inorganic polymer moiety closely adheres to the substrate and the addition-reactive functional groups remain on the support surface.

According to the bonding method of the addition-reactive functional group by the SG method, the organic silicone compound represented by formula (II) is, if desired after being mixed with the organic silicone compound represented by formula (5) at a desired mixing ratio, hydrolyzed and at the same time, polycondensed at —$OR_2$ and —$OR_4$ without causing any reaction at $R_1$ (addition-reactive functional group) in a solution and if desired, in the presence of a catalyst, to obtain a liquid composition containing an inorganic polymer in which the center Si atom is connected through the —Si—O—Si— bond. This composition is coated on the support surface and, if desired, dried, thereby bonding the addition-reactive functional group onto the support. When the SG method is used, the distribution of addition-reactive functional groups bonded and fixed onto the support surface is less affected by the distribution of chemical properties of the support surface, such as acid point or base point. When the organic silicone compound represented by formula (5) is used in combination with the organic silicone compound represented by formula (II), the relative ratio of the addition-reactive functional group site represented by formula (4) to the hydrophilic site represented by formula (6) can be almost determined by the charging ratio of the organic silicone compound represented by formula (II) to the compound represented by formula (5).

In the case of the SG method, an inorganic polymer composition solution carrying addition-reactive functional groups needs be previously prepared. A preferred embodiment thereof is specifically described below. The solvent which can be used in producing a composition suitable for the SG method by hydrolyzing and polycondensing the organic silicone compounds represented by formula (II) and (5), is an alcohol such as methanol, ethanol, propanol, isopropanol, ethylene glycol or hexylene glycol. The solvent is generally used in an amount of from 0.2 to 500 times, preferably from 0.5 to 50 times, more preferably from 1 to 3 times based on the total weight of the organic silicone compounds used. If the use amount is less than 0.2 times, the reaction solution is disadvantageously easily gelled in aging and becomes unstable, whereas if it exceeds 500 times, the reaction requires several days and this is not preferred. The water for hydrolyzing the organic silicone compounds is generally added in an amount of from 0.5 to 1,000 mol, preferably from 1 to 100 mol, more preferably from 1.5 to 10 mol, per mol of the organic silicone compounds. If the amount of water is less than 0.5 mol per mol of the organic silicone compounds, the hydrolysis and subsequent polycondensation reaction proceed very slowly and several days are required until stable surface treatment can be performed, whereas if the amount of water exceeds 1,000 mol per mol of the organic silicone compounds, adhering failure may be caused when the composition is coated on the metal surface and moreover, since the composition is bad in the aging stability and readily gelled, stable coating operation can be difficultly achieved.

In preparing a solution of the composition suitable for the SG method, the reaction temperature is usually in the range of from room temperature to 100° C., however, depending on the kind of the catalyst which will be described below, a temperature of lower than room temperature or higher than 100° C. may be used. The reaction may be performed at a temperature higher than the boiling point of the solvent and if desired, the reactor is preferably equipped with a reflux condenser. Examples of the catalyst which is used if desired, include an acid such as hydrochloric acid, sulfuric acid, a nitric acid, a phosphoric acid, an acetic acid, a malic acid or an oxalic acid, or a base such as ammonia, tetramethylammonium hydroxide, potassium hydroxide or sodium hydroxide. The catalyst is added, based on the total weight of the organic silicone compound represented by formula (II) and the organic silicone compound represented by formula (5) which is additionally added if desired, in an amount of from 0.001 to 1 mol, preferably from 0.002 to 0.7 mol, more preferably from 0.003 to 0.4 mol per mol of the organic silicone compounds. Even if the addition amount of catalyst exceeds 1 mol, no particular profit is obtained in view of economical point as compared with the addition effect.

When a weak acid such as acetic acid or malic acid is used as the catalyst, the reaction temperature is preferably from 40 to 100° C., and when a strong acid such as sulfuric acid or nitric acid is used as the catalyst, the reaction. temperature is preferably from 10 to 60° C. When a malic acid is used as the catalyst, the reaction may be performed at from 10 to 90° C. In the step of preparing a solution of the composition for use in the SG method and the step of coating the solution on a substrate and drying it, heat is applied in many cases and when a volatile acid is used as the catalyst, it volatilizes to attach to and finally corrode the peripheral devices. In the case where this method is used in the process mainly using iron as the material, sulfuric acid and/or phosphoric acid which are non-volatile are preferably used as the catalyst. As described in the foregoing, when a composition comprising the organic silicone compounds represented by formulae (II) and (5), an organic solvent, water and if desired, a catalyst, is reacted by selecting an appropriate reaction temperature, an appropriate reaction time and if desired, an appropriate stirring condition, hydrolysis and polycondensation reaction are caused to produce a polymer or colloidal polymer having an Si—O—Si bond and thereby the liquid composition increases in the viscosity and comes into sol. In the case of preparing a sol solution using both the organic silicone compounds represented by formulae (II) and (5), these two organic silicone compounds may be charged into the reaction vessel from the beginning of reaction or after hydrolysis and polycondensation proceed with only one organic silicone compound for the time being, another organic silicone. compound may be added to complete the reaction. When the above-described sol solution for use in the SG method is allowed to stand at room temperature, the polycondensation reaction may continue to cause gelling. Accordingly, the sol solution once prepared by the method described above may be diluted in advance with a solvent to be used in the dilution at the coating on a support so that the sol solution can be prevented or retarded from gelling.

In order to bond the organic silicone compounds or addition-reactive functional groups in an objective amount onto the support or in order to eliminate unevenness in the distribution of the organic silicone compounds or addition-reactive functional groups on the support, the processing solution is preferably adjusted in the concentration by adding thereto a solvent before the solution is coated on the support. The solvent used to this effect is preferably an alcohol, particularly methanol, however, other solvent, an organic compound, an inorganic additive or a surface active agent may also be added. Examples of the other solvent include methyl ethyl ketone, ethylene glycol monomethyl ether, ethylene glycol monoethyl ether, 2-methoxy ethyl acetate, 1-methoxy-2-propyl acetate, dimethoxyethane, methyl lactate, ethyl lactate, acetylacetone and ethylene glycol. Examples of the organic compound which can be added include epoxy resin, acrylic resin, butyral resin, urethane resin, novolak resin, pyrogallolacetone resin, polyvinyl pyrrolidone, polyvinyl alcohol, polyvinyl methyl ether and polypropylene glycol. Examples of the inorganic additive include colloidal silica and colloidal alumina. The high boiling point solvent such as ethylene glycol and ethylene glycol monomethyl ether, has a function to increase stability of the solution diluted to the concentration at the coating on a support and ensure reaction reproducibility of the addition-reactive functional group bonded to the support. The organic compound such as novolak resin and pyrogallol-acetone resin provides similar results, however, since it has a side effect of reducing hydrophilicity of the support surface obtained, the addition amount thereof must be delicately controlled.

By the method described above, the functional group capable of causing addition reaction by a radical can be bonded onto the support through a covalent bond, and thereon a high-sensitive photopolymerizable photosensitive layer having sensitivity to light of from 400 to 1,000 nm is provided to construct a high-sensitive PS plate which is excellent in the adhesive strength between the photosensitive layer and the support, and sensitive to laser light. More specifically, the plate surface is scanned with an acutely narrowed laser beam to generate radicals on the part exposed to laser light, the radicals cause polymerization of the photosensitive layer and at the same time, addition reaction in the interface between the photosensitive layer and the addition-reactive functional group bonded onto the support surface to form a polymerization pattern faithful to the original such as a letter original or an image original directly on the plate, and the remaining part is eluted out and removed with an aqueous alkali solution or an organic alkali solution or, if desired, with water to thereby obtain a printing plate.

(A) Photopolymerizable Composition

The high-sensitive photopolymerizable composition having sensitivity to visible light according to the present invention, which is coated on a support having bonded thereto addition-reactive functional groups, is preferably a composition comprising the following compounds (i) to (iv), however, the present invention is not limited thereto and any high-sensitive photopolymerizable photosensitive composition having sensitivity to light at from 400 to 1,000 nm may be used.

(i) a polymerizable compound having an addition-polymerizable unsaturated bond, (ii) a linear organic high molecular polymer, (iii) a photopolymerization initiator, and (iv) a sensitizer which can absorb a radiation of from 400 to 1,000 nm, preferably from 400 to 750 nm, and spectrally sensitize the above-described initiator (iii). The photopolymerizable composition capable of laser light exposure may contain a compound (v) selected from the group consisting of the following compounds (a), (b) and (c).

(a) Compound having the formula: $R^1R^2N$—

In the formula, $R^1$ and $R^2$ each represents a hydrogen atom, an alkyl group having from 1 to 18 carbon atoms or an alkyl group having from 1 to 18 carbon atoms and substituted by —$OR^3$, —CO—$R^3$, —CO—$C_6H_4(B)_n$, —$COOR^3$, —NH—CO—$R^3$, —NH—CO—$C_6H_4$—$(B)_n$, —$(CH_2CH_2O)_m$—$R^3$ or a halogen atom (e.g., F, Cl, Br, I) (wherein $R^3$ represents a hydrogen atom or an alkyl group having from 1 to 10 carbon atoms, B represents a dialkylamino group, a hydroxyl group, an acyloxy group, a halogen atom or a nitro group, n represents an integer of from 0 to 4, and m represents an integer of from 1 to 20).

(b) Thio compound represented by the following formula (7):

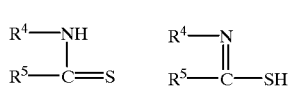

(7)

(c) Compound represented by the following formula (8):

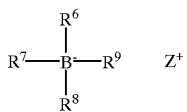
(8)

wherein $R^4$ represents an alkyl group, a substituted alkyl group, an aryl group or a substituted aryl group, $R^5$ represents a hydrogen atom, an alkyl group or a substituted alkyl group, $R^4$ and $R^5$ together represent a nonmetallic atom group necessary for forming a 5-, 6- or 7-membered ring by combining with each other, in which the ring may contain a heteroatom selected from an oxygen atom, a sulfur atom and a nitrogen atom, $R^6$, $R^7$, $R^8$ and $R^9$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^6$, $R^7$, $R^8$ and $R^9$ may combine with each other to form a ring structure, provided that at least one of $R^6$, $R^7$, $R^8$ and $R^9$ is an alkyl group, and $Z^+$ represents an alkali metal cation ion or a quaternary ammonium cation.

Each component of the photopolymerizable composition which can be used in the present invention is described in detail below. The polymerizable compound having an addition-polymerizable unsaturated bond (component (i)) is selected from compounds having at least one, preferably two or more terminal ethylenically unsaturated bonds. Examples thereof include compounds having a chemical form such as a monomer, a prepolymer, namely, a dimer, a trimer or an oligomer, a mixture thereof and a copolymer thereof. Examples of the monomer and the copolymer thereof include an ester of an unsaturated carboxylic acid (e.g., acrylic acid, methacrylic acid, itaconic acid, crotonic acid, isocrotonic acid, maleic acid) with an. aliphatic polyhydric alcohol, and an amide of an unsaturated carboxylic acid with an aliphatic polyhydric amine compound. Specific examples of the ester monomer of an aliphatic polyhydric alcohol compound with an unsaturated carboxylic acid include an acrylic ester such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer; a methacrylic ester such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(acryloxyethoxy)phenyl]dimethylmethane; an itaconic ester such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetramethacrylate; a crotonic ester such as ethylene glycol dicrotonate, tetramethylene glycol dicrotonate, pentaerythritol dicrotonate and sorbitol tetradicrotonate; an isocrotonic ester such as ethylene glycol diisocrotonate, pentaerythritol diisocrotonate and sorbitol tetraisocrotonate; a maleic ester such as ethylene glycol dimaleate, triethylene glycol dimaleate, pentaerythritol dimaleate and sorbitol tetramaleate; and a mixture of these ester monomers.

Specific examples of the amide monomer of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other examples include vinylurethane compounds having two or more polymerizable vinyl groups in one molecule resulting from adding a vinyl monomer having a hydroxyl group represented by the following formula (A) to a polyisocyanate compound having two or more isocyanate groups in one molecule described in JP-B-48-41708:

$$CH_2=C(R)COOCH_2CH(R')OH \quad (A)$$

(wherein R and R' each represents H or $CH_3$).

Further, polyfunctional acrylates and methacrylates such as urethane acrylates as described in JP-A-51-37193, polyester acrylates as described in JP-A-48-64183, JP-B-49-43191 and JP-B-52-30490 and epoxy acrylates resulting from reacting an epoxy resin with a (meth)acrylic acid may be used. Furthermore, those described in Journal of the Adhesion Society of Japan, Vol. 20, No. 7, pp. 300–308 (1984) as photo-curable monomers and oligomers may be used. The use amount of the compound is generally from 5 to 50 wt % (hereinafter simply referred to as "%"), preferably from 10 to 40%, based on all components.

The linear organic high molecular polymer (component (ii)) which can be used in the present invention may be any polymer as long as it is a linear organic high molecular polymer having compatibility with the addition-polymerizable unsaturated bond-containing compound (component (i)). A linear organic high molecular polymer having a group from which hydrogen is easily withdrawn by a sulfur radical is preferably selected, and a water- or alkalescent water-soluble or swellable linear organic high molecular polymer capable of water development or alkalescent water development is more preferably selected. The linear organic high molecular polymer functions as a film forming agent of the composition and is selected depending on the developer used, that is, the kind of the developer such as a water, alkalescent water or organic solvent developer. For example, when a water-soluble organic high molecular polymer is used, water development can be performed. Such a linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic acid group on the side chain is included. An addition product of a cyclic acid anhydride to the addition polymer having a hydroxyl group may also be useful. Among these, a [benzyl (meth)acrylate/(meth)acrylic acid/other addition polymerizable vinyl monomer, if desired] copolymer and an [allyl (meth)acrylate/(meth)acrylic acid/other addition polymerizable vinyl monomer, if desired] copolymer are preferred. In addition, polyvinyl pyrrolidone and polyethylene oxide are useful as the water-soluble linear organic polymer. Further, an alcohol-soluble nylon and a polyether of 2,2-bis(4-hydroxydiphenyl)propane with epichlorohydrin are also useful so as to increase the strength of the cured film. The linear organic high molecular polymer (component (ii)) preferably has on the main chain or the side chain thereof a group from which hydrogen is easily withdrawn by a sulfur radical, more preferably a group from which hydrogen is more easily withdrawn than from the methyl group of toluene by a methyl radical, and still more preferably $R^{10}R^{11}C=CH—CHR^{12}—$, $—CHR^{13}Ar_1$,

wherein $R^{10}$, $R^{11}$, $R^{12}$ and $R^{13}$ each represents a hydrogen atom, an alkyl group, an alkenyl group or an aryl group which may be substituted, and $Ar_1$, $Ar_2$ and $Ar_3$ each represents an aryl group which may be substituted. The linear organic high molecular polymer can be mixed into the entire composition in an arbitrary amount. However, if the amount exceeds 90 wt % based on the weight of the whole composition excluding the weight of solvent, disadvantageous results may come out in view of the strength of an image formed or the like. Accordingly, the amount of the linear organic high molecular polymer is generally from 20 to 90%, preferably from 30 to 80%. The weight ratio of the photopolymerizable ethylenically unsaturated compound (component (i)) to the linear organic high molecular polymer (component (ii)) is generally from 1/9 to 7/3, preferably from 3/7 to 5/5.

Examples of the photopolymerization initiator (component (iii)) which can be used in the present invention include benzyl, benzoin, benzoin ether, Michler's ketone, anthraquinone, acridine, phenazine, benzophenone, 2-ethylanthraquinone, a trihalomethyltriazine compound, a ketoxime ester, a photo-reductive dye such as Rose Bengale, Eosine and erythrosine described in U.S. Pat. No. 2,850,445, a combination system of a dye with an initiator, such as a composite initiating system of a dye with an amine described in JP-B-44-20189, a system of hexaarylbiimidazoles, a radical former and a dye described in JP-B-45-37377, a system of hexaarylbiimidazole and a p-dialkylaminobenzylidene ketone described in JP-B-47-2528 and JP-A-54-155292, a system of a dye with an organic peroxide described in JP-B-62-1641, JP-A-59-1504, JP-A-59-140203, JP-A-59-189340, U.S. Pat. No. 4,766,055 and JP-A-62-174203, a system of a dye with an active halogen compound described in JP-A-54-15102, JP-A-58-15503, JP-A-63-178105, JP-A-63-258903 and JP-A-2-63054, and a system of a dye with a borate compound described in JP-A-62-143044, JP-A-62-150242, JP-A-64-13140, JP-A-64-13141, JP-A-64-13142, JP-A-64-13143, JP-A-64-13144, JP-A-64-17048, JP-A-64-72150, JP-A-1-229003, JP-A-1-298348, JP-A-1-138204, JP-A-2-179643 and JP-A-2-244050.

Examples of the above-described hexaarylbiimidazole include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole. Examples of the ketoxime ester include 3-benzoyloxyiminobutan-2-one, 3-actoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

Preferred examples of the sensitizer (component (iv)) which can be used in the present invention include a cyanine dye, a merocyanine dye, a (keto)coumarin dye, a (thio)xanthene dye, an acridine dye, a thiazole dye, a thiazine dye, an oxazine dye, an azine dye, an aminoketone dye, a squalilium dye, a pyridinium dye, a (thia)pyrylium dye, a porphyrin dye, a triarylmethane dye, a (poly)methine dye, an aminostyryl compound and an aromatic polycyclic hydrocarbon. Among these, preferred sensitizers are a cyanine dye, a merocyanine dye, a (keto)coumarin dye, a (thio)xanthene dye, a (poly)methine dye and an aminostyryl compound.

Examples of the cyanine dye include those described in JP-A-64-13140. Examples of the merocyanine dye include those described in JP-A-59-89303, JP-A-2-244050 and JP-A-2-179643. Examples of the (keto)coumarin dye include those described in *Polymer. Eng. Sci.*, 23, 1022 (1983) and JP-A-63-178105. Examples of the (thio)xanthene dye include those described in JP-A-64-13140 and JP-A-1-126302. Examples of the (poly)methine dye include those described in Japanese Patent Application Nos. 3-152062, 3-232037 and 3-264494. Examples of the aminostyryl compound include those described in JP-A-55-50001, JP-A-2-69, JP-A-2-63053 and JP-A-2-229802. The above-described compound (iv) which can absorb light at from 400 to 1,000 nm and spectrally sensitize the photopolymerization initiator may be suitably used individually or in combination thereof in the photopolymerizable photosensitive composition of the present invention, however, the following compound which can absorb light at from 400 to 750 nm and spectrally sensitize the photopolymerization initiator is more preferably used. The cyanine dye represented by the following formula is particularly useful.

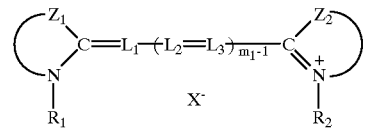

wherein $Z_1$ and $Z_2$ each represents an atomic group necessary for forming a heterocyclic nucleus which is generally used in the cyanine dye, preferably a thiazole nucleus, a thiazoline nucleus, a benzothiazole nucleus, a naphthothiazole nucleus, an oxazole nucleus, an oxazoline nucleus, a benzoxazole nucleus, a naphthoxazole nucleus, a tetrazole nucleus, a pyridine nucleus, a quinoline nucleus, an imidazoline nucleus, an imidazole nucleus, a benzimidazole nucleus, a naphthoimidazole nucleus, a selenazoline nucleus, a selenazole nucleus, a benzoselenazole nucleus, a naphthoselenazole nucleus or an indolenine nucleus. These nuclei each may be substituted by a lower alkyl group such as methyl, a halogen atom, a phenyl group, a hydroxyl group, an alkoxy group having from 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group or a nitro group. $L_1$, $L_2$ and $L_3$ each represents a methine group or a substituted methine group. Examples of the substituted methine group include a methine group substituted by a lower alkyl group such as methyl or ethyl, a phenyl group, a substituted phenyl group, a methoxy group, an ethoxy group or an aralkyl group such as phenethyl.

$L_1$ and $R_1$, $L_3$ and $R_2$, or $L_2$ and $L_3$ when $m_1$ is 3 may be alkylene crosslinked to form a 5- or 6-membered ring. $R_1$ and $R_2$ each represents a lower alkyl group (preferably an alkyl group having from 1 to 8 carbon atoms), an alkyl group substituted by a carboxyl group, a sulfo group, a hydroxyl group, a halogen atom, an alkoxy group having from 1 to 4 carbon atoms, a phenyl group or a substituted phenyl group (preferably the alkylene moiety having from 1 to 5 carbon atoms), such as β-sulfoethyl, γ-sulfopropyl, γ-sulfobutyl, δ-sulfobutyl, 2-[(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl and 3,3,3-trifluoroethyl), an allyl group or other substituted alkyl group usually used in the N-substituent group of the cyanine dye. $m_1$ represents 1, 2 or 3, and $X^-$ represents a halogen ion.

Particularly suitable examples of the cyanine dye are set forth below.

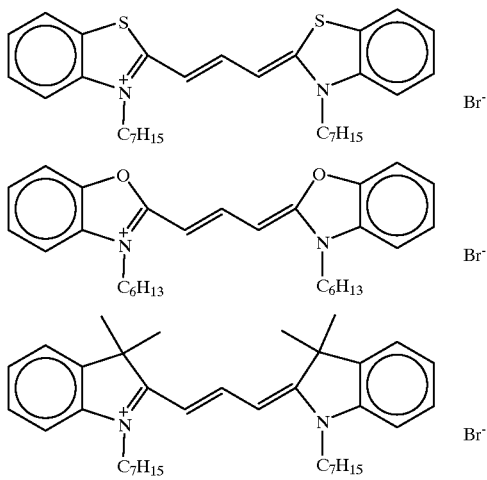

The merocyanine dye represented by the following formula is particularly useful:

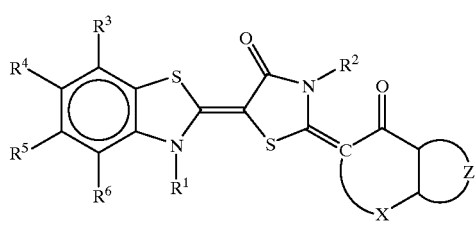

wherein $R^1$ and $R^2$ each independently represents a hydrogen atom, an alkyl group, a substituted alkyl group, an alkoxyl group, an alkoxycarbonyl group, an aryl group, a substituted aryl group or an aralkyl group, $R^3$, $R^4$, $R^5$ and $R^6$ each independently represents the group described for $R^1$ or $R^2$, an alkylthio group, an arylthio group, an amino group or a substituted amino group, X represents a nonmetallic atom group necessary for forming a 5-, 6- or 7-membered ring, and Z represents a nonmetallic atom group necessary for forming a substituted or unsubstituted aromatic ring or a substituted or unsubstituted heteroaromatic ring. A particularly suitable example of the merocyanine dye is set forth below.

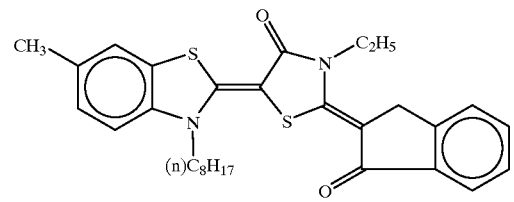

The merocyanine dye represented by the following formula is also particularly useful:

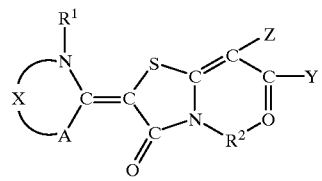

wherein $R^1$ and $R^2$ each independently represents a hydrogen atom, an alkyl group, a substituted alkyl group, an alkoxycarbonyl group, an aryl group, a substituted aryl group or an aralkyl group, A represents an oxygen atom, a sulfur atom, a selenium atom, a tellurium atom, an alkyl- or aryl-substituted nitrogen atom or a dialkyl-substituted carbon atom, X represents a nonmetallic atom group necessary for forming a nitrogen-containing 5-membered heterocyclic ring, Y represents a substituted phenyl group, a unsubstituted or substituted poynuclear aromatic ring or a unsubstituted or substituted heteroaromatic ring, and Z represents a hydrogen atom, and alkyl group, a substituted alkyl group, an aryl group, a substituted aryl group, an arlkyl group, an alkoxy group, an alkylthio group, an arylthio group, a substituted amino group, an acyl group or an alkoxycarbonyl group, and Z may combine with Y to form a ring. Particlarly suitable examples of the merocyanine dye are set forth below.

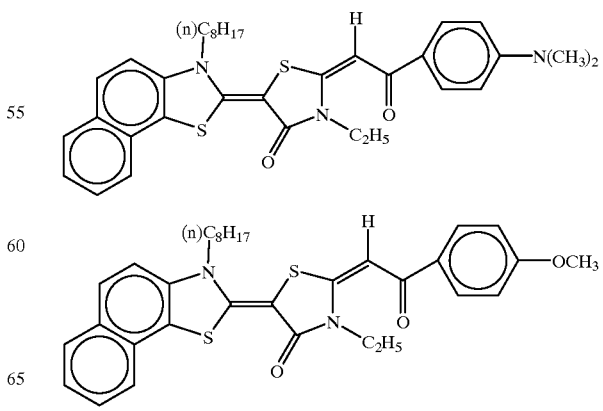

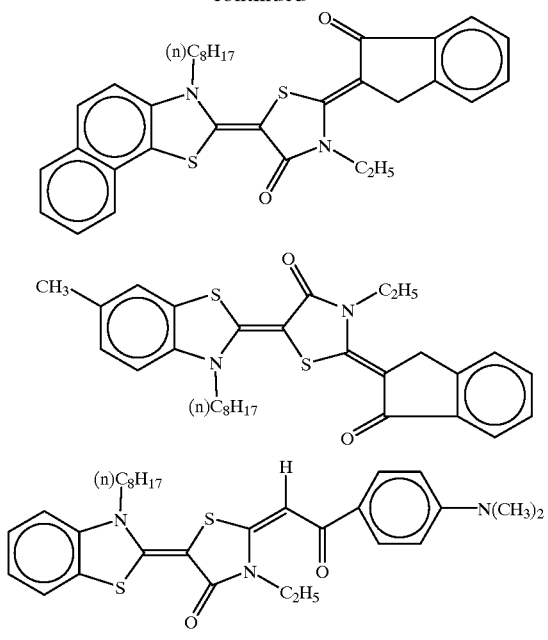

The (keto)coumarin dye represented by the following formula is particularly useful:

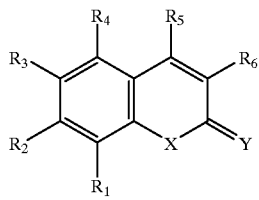

wherein $R_1$ to $R_4$ each independently represents a hydrogen atom, a halogen atom, an alkyl group, a substituted alkyl group, an aryl group, a substituted aryl group, a hydroxyl group, an alkoxy group, a substituted alkoxy group, an amino group, or a substituted amino group, $R_1$, $R_2$, $R_3$ or $R_4$ may form a ring consisting of nonmetallic atoms, together with the carbon atom(s) to which $R_1$, $R_2$, $R_3$ or $R_4$ may combine, $R_5$ represents a hydrogen atom, an alkyl group, a substituted alkyl group, an aryl group, a substituted aryl group, a heteroaromatic group, a substituted heteroaromatic group, a cyano group, an alkoxy group, a substituted alkoxy group, a carboxyl group, an alkenyl group or a substituted alkenyl group, $R_6$ represents $R_7$ or $—Z—R_7$ (wherein $R_7$ is selected from the groups described for $R_5$ and Z represents a carbonyl group, a sulfonyl group, a sulfinyl group or an arylenedicarbonyl group), $R_5$ and $R_6$ may together form a ring consisting of nonmetallic atoms, X represents O, S, NH or a nitrogen atom having a substituent. Y represents an oxygen atom or $=CG_1G_2$ (wherein $G_1$ and $G_2$, which may be the same or different, each represents a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an aikylthio group, an arylthio group, an alkylsulfonyl group, an arylsulfonyl group or a fluorosulfonyl group, provided that $G_1$ and $G_2$ are not a hydrogen atom at the same time, and $G_1$ and $G_2$ may together form a ring consisting of nonmetallic atoms together with the carbon atom which $G_1$ and $G_2$ are bonded to). Particularly suitable examples of the (keto)coumarin dye are set forth below.

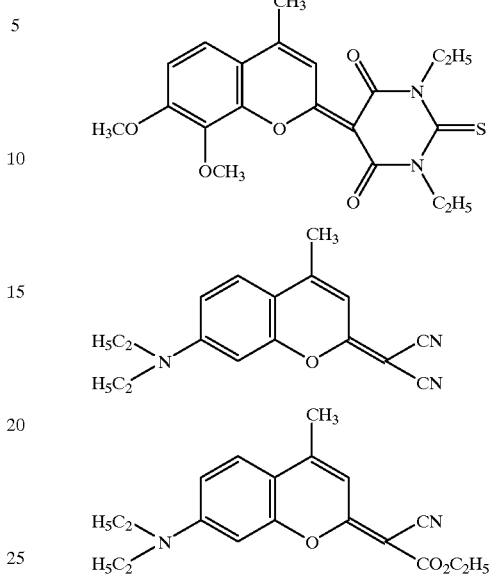

The xanthene dye represented by the following formula is particularly useful.

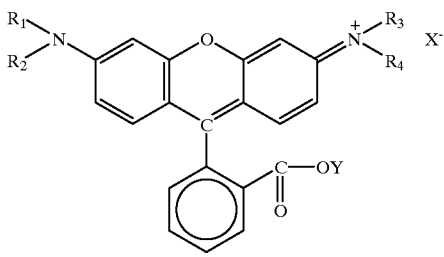

wherein $R_1$, $R_2$, $R_3$ and $R_4$ each independently represents a hydrogen atom, an alkyl group having from 1 to 6 carbon atoms, or an aryl group, X represents a halogen ion, Y represents an alkyl group, an aryl group, a hydrogen atom or an alkali metal. A particularly suitable example of the xanthene dye is set forth below:

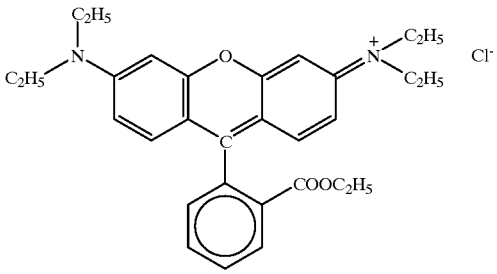

The (poly)methine dye represented by the following formula is particularly useful:

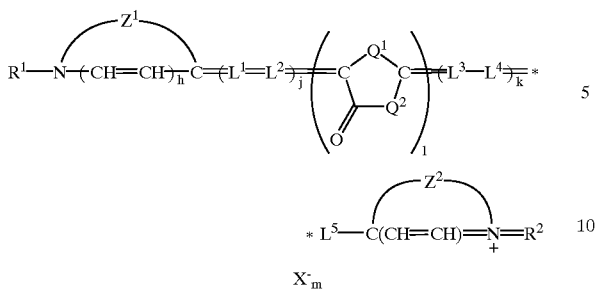

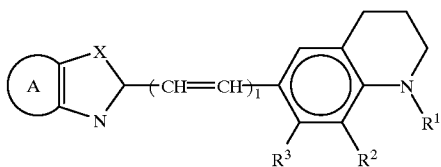

wherein $Z^1$ and $Z^2$ each represents a nonmetallic atom group necessary for forming a 5- or 6-membered nitrogen-containing heterocyclic ring usually used in the cyanine dye, $R^1$ and $R^2$ each represents an alkyl group, $Q^1$ and $Q^2$ represent an atomic group necessary for forming a 4-thiazolidinone ring, a 5-thiazolidinone ring, a 4-imidazolidinone ring, a 4-oxazolidinone ring, 5-oxazolidinone, a 5-imidazolidinone ring or a 4-dithiolanone ring, by combining with each other, $L^1$, $L^2$, $L^3$, $L^4$ and $L^5$ each represents a methine group, m represents 1 or 2, i and h each represents 0 or 1, l represents 1 or 2, j and k each represents 0, 1, 2 or 3, $X^-$ represents a counter anion. Particularly suitable examples of the (poly)methine dye are set forth below:

The aminostyryl compound represented by the following formula is particularly useful:

wherein the ring A represents a benzene or naphthalene ring which may be substituted, X represents a divalent atom or a divalent group, $R^1$ represents an alkyl group, $R^2$ and $R^3$ each represents a hydrogen atom, an alkyl group, an alkoxyl group or an alkylthio group, $R^1$ and $R^2$ may combine with each other, and l represents 0, 1 or 2. Particularly suitable examples of the aminostyryl compound are set forth below.

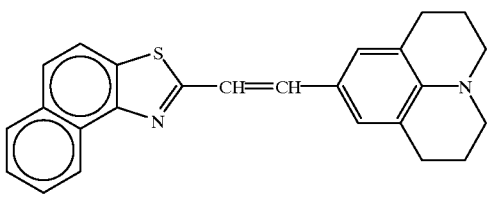

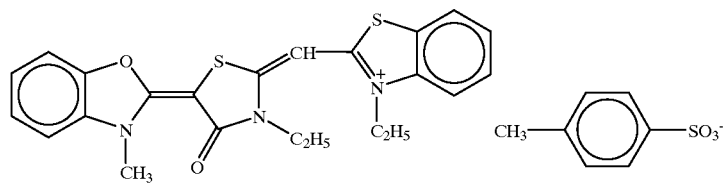

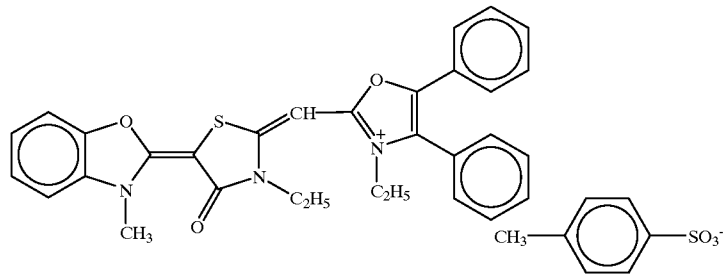

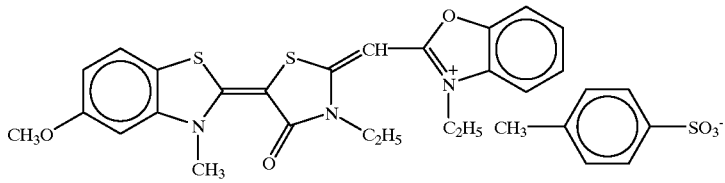

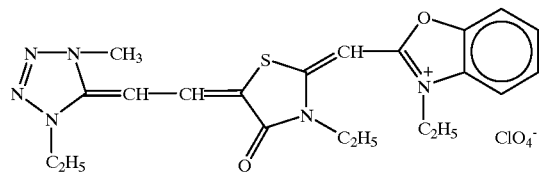

-continued

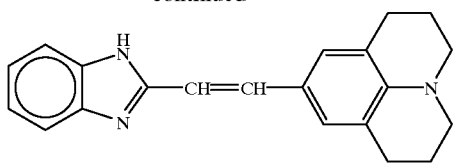

Examples of the compound belonging to the group (a) as component (v) which can be used in the present invention include various amines and specific examples thereof are set forth below.

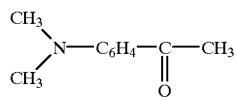 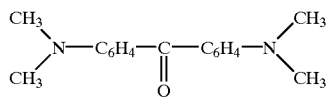 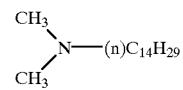

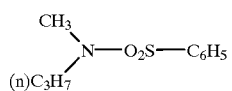 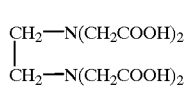 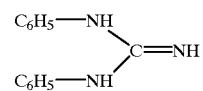

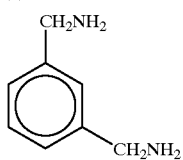 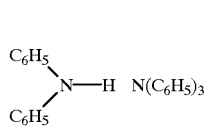 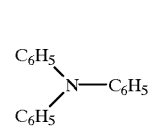

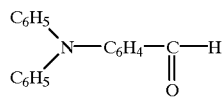 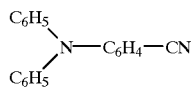 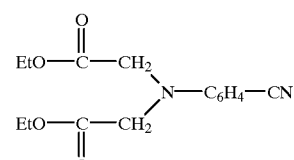

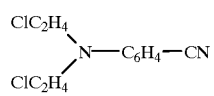 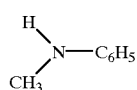 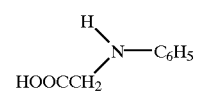

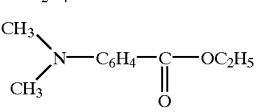 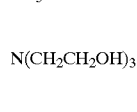 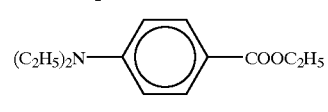

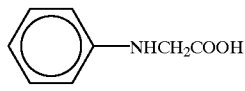 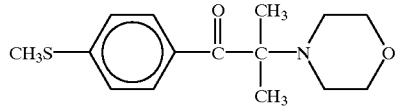

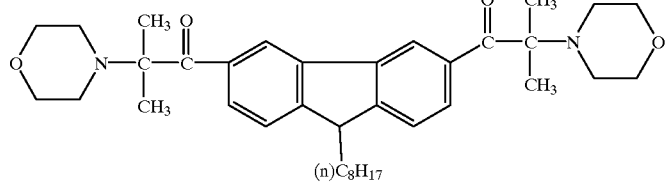

Specific examples of the thio compound represented by formulas (7) belonging to the group (b) as component (v) include the compounds having the groups $R^4$ and $R^5$ as shown in the Table below, however, in compounds 15 to 46, a group formed by $R^4$ and $R^5$ is shown.

TABLE 1

| Compound No. | $R^4$ | $R^5$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |

TABLE 1-continued

| Compound No. | $R^4$ | $R^5$ |
|---|---|---|
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_3$— | |

TABLE 1-continued

| Compound No. | R$^4$ | R$^5$ |
|---|---|---|
| 16 | | —(CH$^2$)$_2$—S— |
| 17 | | —CH(CH$_3$)—CH$_2$—S— |
| 18 | | —CH$_2$—CH(CH$_3$)—S— |
| 19 | | —C(CH$_3$)$_2$—CH$_2$—S— |
| 20 | | —CH$_2$—C(CH$_3$)$_2$—S— |
| 21 | | —(CH$_2$)$_2$O— |
| 22 | | —CH(CH$_3$)—CH$_2$—O— |
| 23 | | —C(CH$_3$)$_2$—CH$_2$—O— |
| 24 | | —CH=CH—N(CH$_3$)— |
| 25 | | —(CH$_2$)$_3$S— |
| 26 | | —(CH$_2$)$_2$CH(CH$_3$)—S— |
| 27 | | —(CH$_2$)$_3$O— |
| 28 | | —(CH$_2$)$_5$— |
| 29 | | —C$_6$C$_4$—O— |
| 30 | | —N=C(SCH$_2$)—S— |
| 31 | | —C$_6$H$_4$—NH— |
| 32 | | —C$_6$H$_4$—NC$_2$H$_5$— |

TABLE 2

| Compound No | R$^4$ R$^5$ |
|---|---|
| 33 | (1) |
| 34 | (2) |
| 35 | (3) |
| 36 | (4) |
| 37 | (5) |
| 38 | (6) |
| 39 | (7) |
| 40 | (8) |
| 41 | (9) |
| 42 | (10) |
| 43 | (11) |
| 44 | (12) |
| 45 | (13) |
| 46 | (14) |

The groups for R$^4$ and R$^5$ in Table 1 above have the following formulae:

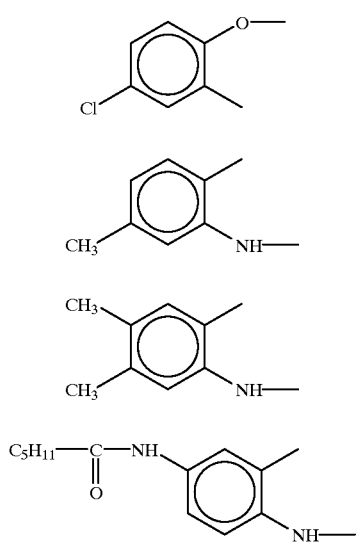

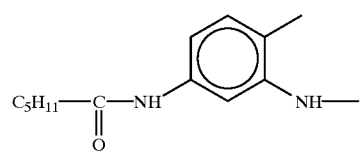

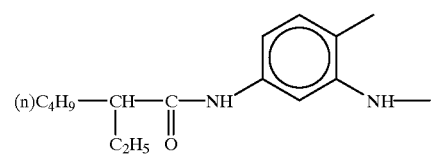

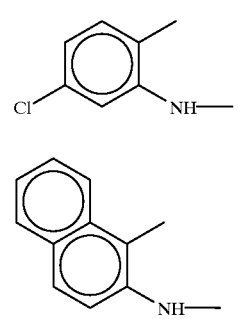

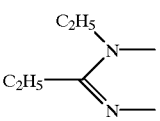

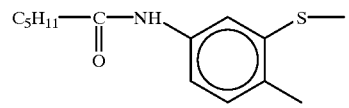

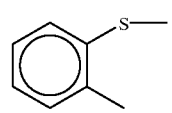

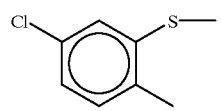

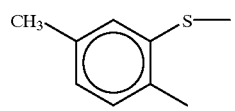

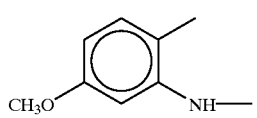

Specific examples of the compound belonging to the group (c) as component (v) include those described in JP-A-2-179643. The photopolymerization initiator (component (iii)) which can be used in the present invention is usually contained in a very low concentration. If the concentration is unduly high, an adverse effect results such as cutting of effective rays. The photopolymerization initiator for use in the present invention is generally used in an amount of from 0.01 to 60%, preferably from 1 to 30%, based on the total amount of the polymerizable compound (component (i)) and the linear organic high molecular polymer (component (ii)). The ratio of the photopolymerization initiator (component (iii)) to the sensitizer (component (iv)) is generally such that the photopolymerization initiator is from 0.05 to 30 parts by weight, preferably from 0.1 to 10 parts by weight, more preferably from 0.2 to 5 parts by weight, per part by weight of the sensitizer (component (iv)). When the component (v) is added, the addition amount thereof is generally from 0.05 to 50 parts by weight, preferably from 0.1 to 30 parts by weight, more preferably from 0.2 to 10 parts by weight, per part by weight of the photopolymerization initiator (component (iii)).

The photopolymerizable photosensitive composition for use in the present invention preferably contains, in addition to the above-described fundamental components, a small amount of a heat polymerization inhibitor to inhibit unnecessary heat polymerization of the polymerizable compound (component (i)) during production or storage of the photosensitive composition. Suitable examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine primary cerium salt and N-nitrosophenylhydroxylamine aluminum salt. The amount of the heat polymerization inhibitor added is generally from 0.001 to 10%, preferably from 0.01 to 5%, based on the weight of the whole composition. If desired, in order to prevent polymerization inhibition by oxygen, a higher fatty acid derivative such as behenic acid or behenic acid amide may be added and unevenly distributed on the surface of the photosensitive layer during the drying process after coating. The amount of the higher fatty acid derivative added is generally from 0.1 to about 20%, preferably from about 0.5 to 10%, of the whole composition. Further, a dye or a pigment may be added for the purpose of coloring the photosensitive layer. The amount of the dye or pigment added is generally from 0.1 to 10%, preferably from 0.5 to 5% of the whole composition. Also, an inorganic filler or other known additives may be added so as to improve physical properties of the cured film.

The photopolymerizable composition of the present invention is dissolved in various organic solvents and then coated on a support. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or as a mixture thereof. The solid concentration in the coating solution is generally from 2 to 50%, preferably from 5 to 30%. The coverage thereof in terms of the weight after drying is generally from 0.1 to 10 $g/m^2$, preferably from 0.5 to 5 $g/m^2$.

(B) Conventional Positive Photosensitive Layer

A photosensitive lithographic printing plate may also be obtained by providing a surface treated layer and a photosensitive layer comprising a known photosensitive composition on an aluminum plate having a hydrophilic surface. The photosensitive composition include a positive photosensitive composition mainly comprising an o-quinonediazide compound and a negative photosensitive composition using as the photosensitive substance a photopolymerizable compound mainly comprising a diazonium salt, an alkali-soluble diazonium salt or an unsaturated double bond-containing monomer, or a photo-crosslinkable compound-containing a cinnamic acid or a dimethylmaleimide group.

The o-naphthoquinonediazide compound used as the positive photosensitive composition is preferably an ester of 1,2-diazonaphthoquinone sulfonic acid with pyrogallol acetone resin described in JP-B-43-28403. Other preferred examples of the o-quinonediazide compound include esters of 1,2-diazonaphthoquinone-5-sulfonic acid with phenolformaldehyde resin described in U.S. Pat. Nos. 3,046,120 and 3,188,210, and esters of 1,2-diazonaphthoquinone-4-sulfonic acid with phenolformaldehyde resin described in JP-A-2-96163, JP-A-2-96165 and JP-A-2-96761. Other useful o-naphthoquinonediazide compounds include those known in a large number of patents, for example, those described in JP-A-47-5303, JP-A-48-63802, JP-A-48-63803, JP-A-48-96575, JP-A-49-38701, JP-A-48-13854, JP-B-37-18015, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

The o-naphthoquinonediazide compound particularly preferred in the present invention is a compound obtained by reacting a polyhydroxy compound having a molecular weight of 1,000 or less with 1,2-diazonaphthoquinonesulfonic acid. Specific examples of the compound include those described in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, U.S. Pat. Nos. 3,102,809, 3,126,281, 3,130,047, 3,148,983, 3,184,310, 3,188,210 and 4,639,406.

In synthesizing the o-naphthoquinonediazide compound, 1,2-diazonaphthoquinonesulfonic acid chloride is preferably reacted in an amount of from 0.2 to 1.2 equivalent, preferably from 0.3 to 1.0 equivalent, based on the hydroxyl group of the polyhydroxy compound. The 1,2-diazonaphthoquinonesulfonic acid chloride which can be used is 1,2-diazonaphthoquinone-5-sulfonic acid chloride or 1,2-diazonaphthoquinone-4-sulfonic acid chloride. The resulting o-naphthoquinonediazide compound is a mixture of those variously different in the site and the amount of 1,2-diazonaphthoquinonesulfonic ester groups introduced, however, the ratio occupied by the compound where all hydroxyl groups are changed to 1,2-diazonaphthoquinonesulfinic esters in the mixture (namely, the content of completely esterified compounds) is preferably 5 mol % or more, more preferably from 20 to 99 mol %. The amount of the positive-working photosensitive compound (including the above-described combinations) present in the photosensitive composition of the present invention is suitably from 10 to 50 wt %, preferably from 15 to 40 wt %.

The o-quinonediazide compound alone may constitute the photosensitive layer but an alkali water-soluble resin is preferably used in combination as the binder. Examples of the alkali water-soluble resin include a novolak-type resin and examples thereof phenol-formaldehyde resin, o-cresol-formaldehyde resin, m-cresol-formaldehyde resin, p-cresol-formaldehyde resin, m/p-mixed cresol-formaldehyde resin and phenol/cresol (any of o-cresol, m-cresol, p-cresol, m/p-mixed cresol and o/m-mixed cresol may be used) mixed formaldehyde resin. Further, phenol-modified xylene resin, polyhydroxystyrene, halogenated polyhydroxystyrene and acrylic resin having a phenolic hydroxyl group as disclosed in JP-A-51-37411 may be used. Other suitable binders include copolymers containing a monomer out of monomers (1) to (12) described above as examples of the monomer for forming a polymer compound added to the backcoat layer, or (13) an unsaturated carboxylic acid such as acrylic acid, methacrylic acid, maleic anhydride or itaconic acid, as the constituent unit and having a molecular weight of usually from 10,000 to 200,000.

Further, a monomer copolymerizable with the above-described monomer may be copolymerized. Furthermore, a copolymer obtained by copolymerizing the above-described monomer and modified, for example, with glycidyl acrylate or glycidyl methacrylate may be used, however, the present invention is by no means limited thereto. The copolymer preferably contains (13) an unsaturated carboxylic acid described above, such as acrylic acid, methacrylic acid, maleic anhydride or itaconic acid. The copolymer preferably has an acid value of from 0 to 10 meq/g, more preferably from 0.2 to 5.0 meq/g. The copolymer preferably has a molecular weight of from 10,000 to 100,000. Further, the copolymer may contain, if desired, polyvinyl butyral resin, polyurethane resin, polyamide resin or epoxy resin. These alkali-soluble polymer compounds may be used individually or in combination of two or more, and the addition amount thereof is 80 wt % or less of the whole photosensitive composition. Furthermore, a condensate of phenol substituted by an alkyl group having from 3 to 8 carbon atoms with formaldehyde, such as t-butylphenolformaldehyde resin or octylphenolformaldehyde resin, is preferably used in combination for improving ink receptivity of the image, as described in U.S. Pat. No. 4,123,279.

The photosensitive composition for use in the present invention preferably contains a cyclic acid anhydride, a phenol or an organic acid for increasing the sensitivity. Examples of the cyclic acid anhydride include phthalic anhydride, tetrahydrophthalic anhydride, hexahydrophthalic anhydride, 3,6-entoxy-$\Delta^4$-tetrahydrophthalic anhydride, tetrachlorophthalic anhydride, maleic anhydride, chloromaleic anhydride, $\alpha$-phenylmaleic anhydride, succinic anhydride and pyromellitic anhydride. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Examples of the organic acids include sulfonic acids, sulfinic acids, alkylsulfuric acids, phosphonic acid, phosphoric esters and carboxylic acids described in JP-A-60-88942 and JP-A-2-96755, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid. The proportion of the cyclic acid anhydrides, the phenols or the organic acids in the photosensitive composition is preferably from 0.05 to 15 wt %, more preferably from 0.1 to 5 wt %.

The photosensitive composition for use in the present invention may contain an nonionic surface active agent described in JP-A-62-251740, JP-A-2-96760 and JP-A-4-68355, or an amphoteric surface active agent described in JP-A-59-121044 and JP-A-4-13149, so as to broaden the processing stability against the development conditions (so-called development latitude). Specific examples of the nonionic surface active agent include sorbitan tristearate, sorbitan monopalmitate, sorbitan trioleate, monoglyceride stearate, polyoxyethylene sorbitan monooleate and polyoxyethylene nonylphenyl ether. Specific examples of the amphoteric surface active agent include alkyldi(aminoethyl) glycine, alkylpolyaminoethylglycine hydrochloride, 2-alkyl-N-carboxyethyl-N-hydroxyethylimidazoliniumbetaine and amphoteric surface active agents of N-tetradecyl-N,N-betaine type (e.g., Amorgen K, trade name, produced by Dai-ichi Kogyo KK) and alkylimidazoline type (e.g., Lebon 15, trade name, produced by Sanyo Kasei KK). The occupation ratio of the nonionic surface active agent or the amphoteric surface active agent in the photosensitive composition is preferably from 0.05 to 15 wt %, more preferably from 0.1 to 5 wt %.

The photosensitive composition for use in the present invention may contain a printing out agent for obtaining a visible image immediately after exposure, or a dye or pigment as an image coloring agent. A representative example of the printing out agent is a combination of a compound which releases an acid on exposure (a photo acid-releasing agent) and an organic dye capable of forming a salt. Specific examples thereof include a combination of o-naphthoquinonediazide-4-sulfonic acid halogenide with a salt-forming organic dye described in JP-A-50-36209 and JP-A-53-8128, and a combination of a trihalomethyl compound with a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole compound and a triazine compound, and either type compound is excellent in the aging stability and provides a clear printed out image. The image coloring agent may be the above-described salt-forming organic dye or other dye. Inclusive of the salt-forming organic dye, suitable dyes include an oil-soluble dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Co., Ltd.), Victoria Pure Blue, Crystal Violet (CI42555), Methyl Violet (CI42535), Ethyl Violet, Rhodamine B (CI45170B), Malachite Green (CI42000) and Methylene Blue (CI52015). Further, the dyes described in JP-A-62-293247 are particularly preferred.

The photosensitive composition for use in the present invention is dissolved in a solvent which dissolves the above-described components and then coated on an aluminum plate support. The solvent used here includes the organic solvents described in JP-A-62-251739 which can be used individually or as a mixture. The photosensitive composition of the present invention is dissolved and dispersed at a solid concentration of from 2 to 50 wt %, then coated on a support and dried. The coating amount of the photosensitive composition layer (photosensitive layer) provided on the support varies depending on the use, however, it is generally, in terms of the weight after drying, preferably from 0.3 to 4.0 g/m$^2$. As the coating. amount is smaller, the exposure amount for obtaining an image can be reduced, however, the layer strength lowers. As the coating amount is larger, the exposure amount is more required, however, the photosensitive layer can be strong and for example, when used as a printing plate, the printing plate can have a high printable sheet number (high press life). The photosensitive composition of the present invention may contain a surface active agent for improving the property of the coated surface, for example, a fluorine surface active agent described in JP-A-62-170950. The amount of the surface active agent added is preferably from 0.001 to 1.0 wt %, more preferably from 0.005 to 0.5 wt %, based on the entire photosensitive composition.

(C) Conventional Negative Photosensitive Layer

The photosensitive composition for a negative PS plate to which the surface treated layer of the present invention is applied, comprises a photosensitive layer containing a photosensitive diazo compound, a photopolymerizable photosensitive layer or a photo-crosslinkable photosensitive layer. Among these, a photo-curable photosensitive copying material comprising a photosensitive diazo compound is taken as an example and described in detail. A suitable photosensitive diazo compound for use in the PS plate according to the present invention is a diazo resin obtained by condensing an aromatic diazonium salt with an organic condensing agent containing a reactive carbonyl group, preferably an aldehyde such as formaldehyde or acetaldehyde, or an acetal, in an acidic medium. A most representative example thereof is a condensate of p-diazophenylamine with formamide. The synthesis method of these diazo resins is described, for example, in U.S. Pat. Nos. 2,679,498, 3,050,502, 3,311,605 and 3,277,074. Another suitable photosensitive diazo compound is a copolycondensed diazo compound of an aromatic diazonium salt with a substituted aromatic compound containing no diazonium group described in JP-B-49-48001, and a copolycondensed diazo compound with an aromatic compound substituted by an alkali-soluble group such as a carboxyl group or a hydroxyl group, is particularly preferred. Further, photosensitive diazo compounds obtained by condensing an aromatic diazonium salt with a reactive carbonyl compound having an alkali-soluble group described in JP-A-4-18559 and Japanese Patent Application Nos. 2-321823 and 2-299551 are also suitably used.

Some diazo resins comprise an inorganic anion such as a mineral acid (e.g., hydrochloric acid, hydrobromic acid, sulfuric acid, phosphoric acid) or a complex salt with zinc chloride, as the counter anion of the diazonium salt, however, diazo resins which are substantially insoluble in water and soluble in an organic solvent, are more preferred. These preferred diazo resins are described in detail in JP-B-47-1167 and U.S. Pat. No. 3,300,309. Further, diazo resins containing a halogenated Lewis acid such as tetrafluoroboric acid or hexafluorophosphoric acid, or a perhalogen acid such as perchloric acid or periodic acid, as the counter anion described in JP-A-54-98613 and JP-A-56-121031 are suitably used. Furthermore, diazo resins containing a sulfonic acid having a long-chain alkyl group, as the counter anion described in JP-A-58-209733, JP-A-62-175731 and JP-A-63-262643 are also suitably used. The photosensitive diazo compound is added to the photosensitive layer in an amount of from 5 to 50 wt %, preferably from 8 to 20 wt %.

The photosensitive diazo compound for use in the present invention can be preferably used in combination with an alkali water-soluble or swellable lipophilic polymer compound as the binder. Examples of the lipophilic polymer compounds include copolymers containing a monomer out of monomers (1) to (13) described above with respect to the positive photosensitive composition, as the constituent unit and having a molecular weight of usually from 10,000 to 200,000. Further, polymer compounds obtained by copolymerizing a monomer (14) or (15) described below, as the constituent unit may also be used. Monomer (14) is an unsaturated imide such as maleimide, N-acryloylacrylamide, N-acetylacrylamide, N-propionylacrylamide, N-(p-chlorobenzoyl)acrylamide, N-acetylacrylamide, N-acryloylmethacrylamide, N-acetylmethacrylamide, N-propionylmethacrylamide and N-(p-chlorobenzoyl)methacrylamide, and monomer (15) is an unsaturated monomer having a crosslinkable group on the side chain thereof, such as N-[6-(acryloyloxy)hexyl]-2,3-dimethylmaleimide, N-[2-(methacryloyloxy)hexyl]-2,3-dimethylmaleimide and vinyl cinnamate. Further, a monomer copolymerizable with the above-described monomer may be copolymerized thereto. Furthermore, a copolymer obtained by copolymerizing the above-described monomer may be modified, for example, with glycidyl acrylate or glycidyl methacrylate, however, the present invention is by no means limited thereto. The above-described copolymer preferably contains (13) an unsaturated carboxylic acid and the copolymer preferably has an acid value of from 0 to 10 meq/g, more preferably from 0.2 to 5.0 meq/g.

The copolymer preferably has a molecular weight of from 10,000 to 100,000. Further, the copolymer may contain, if desired, polyvinyl butyral resin, polyurethane resin, polyamide resin or epoxy resin. Also, novolak-type resin, phenol-modified xylene resin, polyhydroxystyrene, halogenated polyhydroxystyrene, and alkali-soluble resin containing a phenolic hydroxyl group disclosed in JP-A-51-34711 may be used. These alkali-soluble polymer compounds may be used individually or in combination of two or more thereof, and the compound is contained usually in an amount of from 40 to 95 wt % of the solids content of the whole photosensitive composition.

The photosensitive composition for use in the present invention may contain an ink receptivity agent for improving ink receptivity of the image (for example, a half esterified compound of a styrene-maleic acid copolymer by an alcohol described in JP-A-55-527, novolak-resin or a 50% fatty acid ester of p-hydroxystyrene). Further, a plasticizer may be added for imparting flexibility or abrasion resistance to the coated layer. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydofurfuryl oleate, and oligomers and polymers of acrylic acid or methacrylic acid. Among these, tricresyl phosphate is preferred. Furthermore, the photosensitive composition for use in the present invention may contain, for example, phosphoric acid, phosphorous acid, citric acid, oxalic acid, dipicolinic acid, benzenesulfonic acid, naphthalenesulfonic acid, sulfbsalicylic acid, 4-methoxy-2-hydroxybenzophenone- 5-sulfonic acid or tartaric acid for achieving widespread stability in aging.

The photosensitive composition for use in the present invention may contain a printing out agent for obtaining a visible image immediately after exposure, or a dyestuff such as a dye or a pigment as an image coloring agent. A dye which reacts with a free radical or an acid to change the color tone is preferably used as the above-described dye. Examples of the dye which changes from a colored dye to a colorless dye or a colored dye different in the tone include triphenylmethane dyes, diphenylmethane dyes, oxazinedyes, xanthene dyes, iminonaphthoquinone dyes, azomethine dyes and anthraquinone dyes such as, as representative examples thereof, Victoria Pure Blue BOH (produced by Hodogaya Chemical Co., Ltd.), Oil Yellow #101, Oil Yellow #103, Oil Pink #312, Oil Red, Oil Green BG, Oil Blue BOS, Oil Blue #603, Oil Black BY, Oil Black BS, Oil Black T-505 (all produced by Orient Chemical Co., Ltd.), Patent Pure Blue (produced by Sumitomo Mikuni Kagaku KK), Crystal Violet (CI42555), Methyl Violet (CI42535), Ethyl Violet, Rhodamine B (CI145170B), Malachite Green (CI42000), Methylene Blue (CI52015), Brilliant Blue, Methyl Green, Erythrosine B, Basic Fuchsine, m-Cresol Purple, Auramine, 4-p-diethylaminophenyliminaphthoquinone and cyano-p-diethylaminophenylacetanilide.

Examples of the discoloring agent which changes from a colorless dye from a colored dye include leuco dyes and primary and secondary arylamine dyes such as, as representative examples thereof, triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p', p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane and p,p',p"-triaminotriphenylmethane. Among these, preferred are triphenylmethane dyes and diphenylmethane dyes, more preferred are triphenylmethane dyes and particularly preferred is Victoria Pure Blue BOH. The dye is contained in the photosensitive composition usually in an amount of approximately from 0.5 to 10 wt %, preferably on the order of from 1 to 5 wt %.

The photosensitive composition of the present invention may contain a cyclic acid anhydride, a phenol, an organic acid or a higher alcohol for increasing the developability. The photosensitive composition for use in the present invention is dissolved in a solvent which dissolves the above-described components and then coated on an aluminum plate support. The solvent used here includes the organic solvents described in JP-A-62-251739 which can be used individually or as a mixture. The photosensitive composition of the present invention is dissolved and dispersed at a solid concentration of from 2 to 50 wt %, then coated on a support and dried. The coating amount of the photosensitive composition layer (photosensitive layer) provided on the support varies depending on the use, however, it is generally, in terms of the weight after drying, preferably from 0.3 to 4.0 g/m². As the coating amount is smaller, the exposure amount for obtaining an image can be reduced, however, the layer strength decreases. As the coating amount is larger, the exposure amount is more required, however, the photosensitive layer can be strong and for example, when used as a printing plate, the printing plate can have a high printable sheet number (high press life). The photosensitive composition of the present invention may contain, similarly to the above-described positive photosensitive composition, a surface active agent for improving the property of the coated surface. In producing the photosensitive printing plate of the present invention, the backcoat layer on the back surface may be provided on the support either before or after coating of the photosensitive composition layer on the front surface, or these layers may be coated simultaneously.

In the present invention, the composition starting from the compound represented by formula (I) is suitably used in combination with (A) the photopolymerizable compound, (B) the conventional positive photosensitive layer or (C) the conventional negative photosensitive layer described above, and the composition starting from the compound represented by formula (II) is suitably used in combination with (A) the photopolymerizable compound described above.

The present invention will be described in greater detail below by referring to the examples, but the present invention should not be construed as being limited to these examples.

EXAMPLE 1

A 0.30 mm-thick aluminum plate was subjected to graining of the surface thereof using a nylon brush and a water suspension of 400-mesh pumice and then well washed with water. After dipping in a 10% sodium hydroxide at 70° C. for 60 seconds to effect etching, the plate was washed with running water, neutralization-washed with a 20% nitric acid and then washed with water. The resulting substrate was subjected to electrolytic surface-roughening treatment using a sine waveform alternating current under conditions of $V_A$=12.7 V in a 1% aqueous nitric acid solution at an anode electricity quantity of 160 coulomb/dm². The surface roughness measured was $0.6\mu$ (Ra indication). Subsequently, the plate was dipped in a 30% aqueous sulfuric acid solution to effect desmutting at 55° C. for 2 minutes and then subjected to anodization in a 20% aqueous sulfuric acid solution at a current density of 2 A/dm² for 2 minutes to have a thickness of the anodized film of 2.7 g/m² (the aluminum plate processed until this step is hereinafter called an "AD substrate"). A substrate was prepared by dipping the AD substrate in a bath of a 2.5 wt % aqueous solution of No. 3 sodium silicate heated at 70° C. for 14 seconds, followed by washing with water and air drying (this plate is called as an "SI substrate").

A liquid composition (Sol Solution A1) for the SG method was prepared through the following procedure.

Into a mixed solution consisting of 130 parts by weight of methanol, 20 parts by weight of water and 16 parts by weight of a 85% phosphoric acid, 0.24 parts by weight of phenylphosphonic acid was dissolved, and the resulting solution was mixed with a mixture of 50 parts by weight of tetraethyl silicate and 48 parts by weight of 3-methacryloxypropyltrimethoxysilane and stirred. In about 5 minutes, heat was generated. After allowing the mixed solution to react for 60 minutes, the contents were transferred to another vessel, and thereto 3,000 parts by weight of methanol was added to obtain Sol Solution A1.

The thus-obtained Sol Solution A1 was neither changed to a solid nor precipitated even after 3 months when it was stored in a poly bottle or the like under sealing, however, if the addition of 3,000 parts by weight of methanol was omitted from the above procedure, solid matters were deposited after 3 months.

Then, using an AD substrate or SI substrate and Sol Solution A1, laser light-sensitive PS plates were prepared through the following procedure.

Sol Solution A1 was diluted with a mixed solution of methanol and ethylene glycol (weight ratio: 9:1), applied to the substrate by a whirler to have an Si coverage of 3 mg/m², and dried at 100° C. for 1 minute.

On each of the thus-treated substrates, High-sensitive Photopolymerizable Composition 1 having the following composition was coated to have a dry coated weight of 1.4 g/m² and dried at 80° C. for 2 minutes to form a photosensitive layer.

| Photopolymerizable Composition 1: | |
|---|---|
| Trimethylolpropane tri(acryloyloxy-propyl) ether | 2.0 g |
| Linear Organic High Molecular Polymer (B$_1$) | 2.0 g |
| Sensitizer (C$_1$) ($\lambda_{max}^{THF}$ 472 nm ($\epsilon$ = 7.4 × 10$^4$)) | 0.13 g |
| Photopolymerization Initiator (D$_1$) | 0.09 g |
| Thio Compound (E$_1$) | 0.08 g |
| Fluorine nonionic surface active agent | 0.03 g |
| Methyl ethyl ketone | 20 g |
| Propylene glycol monomethyl ether acetate | 20 g |

(B$_1$)

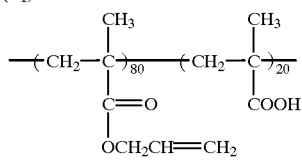

(C$_1$)

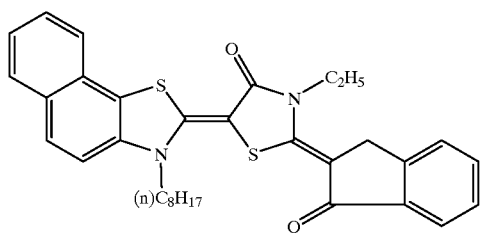

(D$_1$)

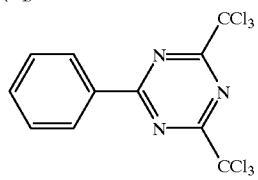

(E$_1$)

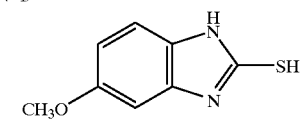

On the photosensitive layer, an aqueous solution of 3 wt % of polyvinyl alcohol (degree of saponification: from 86.5 to 89 mol %, degree of polymerization: 1,000) was coated to have a dry coated weight of 2 g/m$^2$ and then dried at 100° C. for 2 minutes to obtain photosensitive lithographic printing plates according to the present invention.

Sol Solution H1 was prepared thoroughly in the same manner as Sol Solution A1 except that phenylphosphonic acid was not added, and photosensitive lithographic printing plates for comparison were obtained thoroughly in the same manner using an AD substrate or SI substrate and Sol Solution H1.

The photosensitive lithographic printing plates according to the present invention and the photosensitive lithographic printing plates for comparison each were subjected to a photosensitivity test using a visible light having a wavelength of 488 nm as follows.

The plates each was exposed at 0.1 mJ/cm$^2$ in 4,000 dpi using a highly narrowed laser plotter mounted with an air-cooled argon laser of 200 mW, manufactured by Optronics Co., Ltd. To improve the degree of layer curing, the plates each was heat treated at 110° C. for 12 seconds after exposure. The development was performed by dipping each plate in a solution obtained by 18-fold diluting a Developer DP-4 produced by Fuji Photo Film Co., Ltd. with water, at 30° C. for 15 seconds in an automatic processor 850NX manufactured by Fuji Photo Film Co., Ltd.

These lithographic printing plates were evaluated in terms of press life.

The measurement was performed using a printing machine, SOR-KZ manufactured by Heidelberg Co., Ltd., a dampening solution, EU-3 (1:100) produced by Fuji Photo Film Co., Ltd. to which 10% of isopropanol was added, and an ink Craph G (N) produced by Dainippon Ink and Chemicals, Inc. At the same time, background scums in the non-image area and scums on a blanket were visually evaluated.

The evaluation results are shown in Table 3 below. In Table 3, the solid press life indicates the limiting number of sheets which can be normally printed without occurrence of any spot. The highlight press life indicates the limiting number of printed sheets where 2% dots in 175 lines are reproduced, and the evaluation was made here relatively to the PS plate FNSA, manufactured by Fuji Photo Film Co., Ltd., of which limiting number was assumed to be 100. More specifically, FNSA was image-exposed to PS Light manufactured by Fuji Photo Film Co., Ltd. from a distance of 1 m for 1 minute using a negative film, and developed using a solution obtained by diluting an aqueous alkali developer DN-3C produced by Fuji Photo Film Co., Ltd., with tap water at a volume ratio of 1:1 and a solution obtained by diluting a gum solution FN-2 produced by Fuji Photo Film Co., Ltd., with tap water at a volume ratio of 1:1, in an automatic processor PS-800H manufactured by Fuji Photo Film Co., Ltd. Thereafter, the plate was subjected to printing in the same printing machine and measured on the number of printable sheets as an index for press life. Assuming that the number of printable sheets obtained is 100, the press life of the printing plates according to the present invention and of the printing plates for comparison was shown as a relative value thereto.

In the table,

"A": the relative value of the plate is larger than the printable sheet number of FNSA.

"B": the relative value of the plate is equal (100±5) to the printable sheet number of FNSA, and With respect to the background scums in the non-image area and the scums on a blanket, the level equal to FNSA is "A" and inferior to FNSA is "B".

TABLE 3

| | Substrate | Sol Solution | Photosensitive Composition | Press Life Solid | Press Life Highlight | Background Scums in Non-Image Area | Scums on Blanket |
|---|---|---|---|---|---|---|---|
| Example 1 | AD | A1 | Photopolymerizable Composition 1 | B | A | A | A |
| | SI | " | Photopolymerizable Composition 1 | B | A | A | A |
| Comparative Example 1 | AD | H1 | Photopolymerizable Composition 1 | B | A | B | B |
| | SI | " | Photopolymerizable Composition 1 | B | A | B | B |

The photosensitive lithographic printing plates subjected to plate processing with a sol solution having mixed thereto an organic phosphoric acid compound according to the present invention were free from any deterioration in the capability of solid press life and highlight press life and surpassed the comparative lithographic printing plates in the capability with respect to the dislike for generation of background scums in the non-image area and for occurrence of scums on a blanket.

EXAMPLE 2

Sol Solutions A2, K2, I2, P2, N2 and T2 each was prepared in the same manner as in Example 1 by mixing the raw materials shown below.

Sol Solution A2:

| Phenylphosphonic acid | 0.24 parts by weight |
| Methanol | 130 parts by weight |
| Water | 34 parts by weight |
| Sulfuric acid | 12 parts by weight |
| $Si(OC_2H_5)_4$ | 50 parts by weight |
| 3-Methacryloxypropyltrilmethoxy-silane | 48 parts by weight |

Sol Solution K2:

| Catechol | 0.16 parts by weight |
| Methanol | 130 parts by weight |
| Water | 34 parts by weight |
| Sulfuric acid | 12 parts by weight |
| $Si(OC_2H_5)_4$ | 50 parts by weight |
| 3-Methacryloxypropyltrimethoxy-silane | 48 parts by weight |

Sol Solution I2:

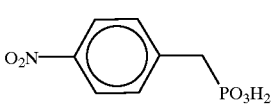

0.31 parts by weight

| Methanol | 130 parts by weight |
| Water | 34 parts by weight |
| Sulfuric acid | 12 parts by weight |
| $Si(OC_2H_5)_4$ | 50 parts by weight |
| 3-Methacryloxypropyltrimethoxy-silane | 48 parts by weight |

Sol Solution P2:

| Pyrogallol | 0.18 parts by weight |
| Methanol | 130 parts by weight |
| Water | 34 parts by weight |
| Sulfuric acid | 12 parts by weight |
| $Si(OC_2H_5)_4$ | 50 parts by weight |

-continued

| 3-Methacryloxypropyltrimethoxy-silane | 48 parts by weight |

Sol Solution N2:

| 2,3-Dihydroxynaphthalene | 0.24 parts by weight |
| Methanol | 130 parts by weight |
| Water | 34 parts by weight |
| Sulfuric acid | 12 parts by weight |
| $Si(OC_2H_5)_4$ | 50 parts by weight |
| 3-Methacryloxypropyltrimethoxy-silane | 48 parts by weight |

Sol Solution T2:

| 2,3,4-Trihydroxybenzophenone | 0.34 parts by weight |
| Methanol | 130 parts by weight |
| Water | 34 parts by weight |
| Sulfuric acid | 12 parts by weight |
| $Si(OC_2H_5)_4$ | 50 parts by weight |
| 3-Methacryloxypropyltrimethoxy-silane | 48 parts by weight |

Then, AD substrates were processed with these sol solutions in the same manner as in Example 1 and Photopolymerizable Composition 1 and polyvinyl alcohol were coated thereon in the same manner as in Example 1 to obtain photosensitive lithographic printing plates.

Further, Sol Solution H2 was prepared thoroughly in the same manner as Sol Solutions A2 to T2 except that a phenol having a molecular weight of 1,000 or less or an organic phosphoric acid compound was not added. An AD substrate was processed with Sol Solution H2 in the same manner and thereafter, Photopolymerizable Composition 1 and polyvinyl alcohol were coated in the same manner to obtain a photosensitive lithographic printing plate for comparison.

The capability of these plates obtained was evaluated in the same manner as in Example 1 and the results obtained are shown in Table 4 below.

TABLE 4

|  | Substrate | Sol Solution | Photosensitive Composition | Press Life | | Background Scums in Non-Image Area | Scums on Blanket |
|---|---|---|---|---|---|---|---|
|  |  |  |  | Solid | Highlight |  |  |
| Example 2 | AD | A2 | Photopolymerizable Composition 1 | B | A | A | A |
|  | " | K2 | Photopolymerizable Composition 1 | B | A | A | A |
|  | " | I2 | Photopolymerizable Composition 1 | B | A | A | A |
|  | " | P2 | Photopolymerizable Composition 1 | B | A | A | A |
|  | " | N2 | Photopolymerizable Composition 1 | B | A | A | A |
|  | " | T2 | Photopolymerizable Composition 1 | B | A | A | A |
| Comparative Example 2 | " | H2 | Photopolymerizable Composition 1 | B | A | B | B |

The photosensitive lithographic printing plates subjected to plate processing with a sol solution having mixed thereto a phenol having a molecular weight of 1,000 or less or an organic phosphoric acid compound according to the present invention were free from any deterioration in the capability of solid press life and highlight press life and surpassed the comparative lithographic printing plate in the capability with respect to the dislike for generation of background scums in the non-image area and for occurrence of scums on a blanket.

EXAMPLE 3

AD substrates were processed in the same manner as in Example 1 using Sol Solution A2, K2 or I2 prepared in Example 2, and on each substrate, High-Sensitive Photopolymerizable Composition 2, 3 or 4 having the following composition was coated to have a dry coated weight of 1.4 g/m² and dried at 80° C. for 2 minutes to form a photosensitive layer.

| Photopolymerizable Composition 2: | |
|---|---|
| Trimethylolpropane tri(acryloyloxy-propyl) ether | 2.0 g |
| Linear Organic High Molecular Polymer ($B_1$) | 2.0 g |
| Sensitizer ($C_2$) ($\lambda_{max}^{THF}$ 474 nm ($\epsilon = 7.4 \times 10^4$)) | 0.13 g |
| Photopolymerization Initiator ($D_1$) | 0.09 g |
| Fluorine nonionic surface active agent | 0.03 g |
| Methyl ethyl ketone | 20 g |
| Propylene glycol monomethyl ether acetate | 20 g |
| ($C_2$) | |

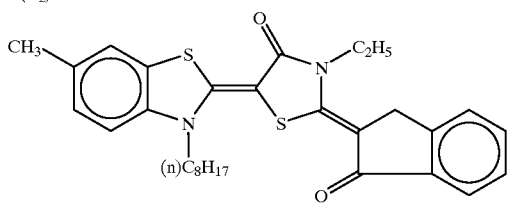

(Note): Linear organic high molecular polymer ($B_1$) and Photopolymerization Initiator ($D_1$) were the same as above.

-continued

| Photopolymerizable Composition 3: | |
|---|---|
| Pentaerythritol triacrylate | 2.0 g |
| Linear Organic High Molecular Polymer ($B_1$) | 2.0 g |
| Sensitizer ($C_2$) | 0.13 g |
| Photopolymerization Initiator ($D_2$) | 0.1 g |
| Thio Compound ($E_2$) | 0.07 g |
| Fluorine nonionic surface active agent | 0.03 g |
| Methyl ethyl ketone | 20 g |
| Propylene glycol monomethyl ether acetate | 20 g |
| ($D_2$) | |

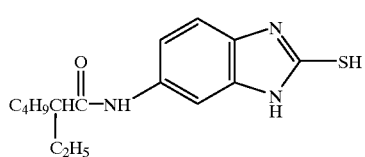

($E_2$)

(Note): Linear organic high molecular polymer ($B_1$) and Sensitizer ($C_2$) were the same as above.

| Photopolymerizable Composition 4: | |
|---|---|
| Pentaerythritol triacrylate | 2.0 g |
| Linear Organic High Molecular Polymer ($B_1$) | 2.0 g |
| Sensitizer ($C_2$) | 0.13 g |
| Photopolymerization Initiator ($D_3$) | 0.1 g |
| Additive (I) | 0.2 g |
| Fluorine nonionic surface active agent | 0.03 g |
| Methyl ethyl ketone | 20 g |
| Propylene glycol monomethyl ether acetate | 20 g |

-continued (D₃)
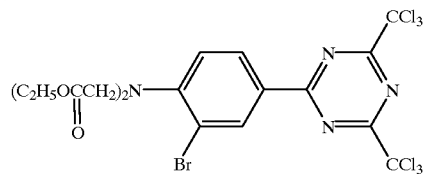

(I)
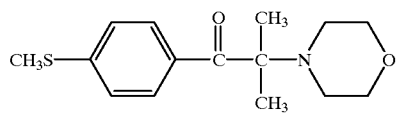

(Note): Linear organic high molecular polymer (B₁) and Sensitizer (C₂) were the same as above.

On each of the thus-obtained photosensitive layers, an aqueous solution of 3 wt % of polyvinyl alcohol (degree of saponification: from 86.5 to 89 mol %, degree of polymerization: 1,000) was coated to have a dry coated weight of 2 g/m² and then dried at 100° C. for 2 minutes to obtain photosensitive lithographic printing plates according to the present invention.

AD substrates were processed in the same manner with Sol Solution H2 used in Comparative Example 2 and each of Photopolymerizable Compositions 2 to 4 and polyvinyl alcohol were coated on each plate in the same manner to obtain photosensitive lithographic printing plates for comparison.

These photosensitive lithographic printing plates were subjected to evaluation of capability in the same manner as in Example 1 and the results obtained are shown in Table 5 below.

The photosensitive lithographic printing plates subjected to plate processing with a sol solution having mixed thereto a phenol having a molecular weight of 1,000 or less or an organic phosphoric acid compound according to the present invention were free from any deterioration in the capability of solid press life and highlight press life and surpassed the comparative lithographic printing plates in the capability with respect to the dislike for generation of background scums in the non-image area and for occurrence of scums on a blanket.

EXAMPLE 4

Sol Solutions A4 and L4 each was prepared in the same manner as in Example 1 by mixing the raw materials shown below.

| Sol Solution A4: | |
| --- | --- |
| Phenylphosphonic acid | 0.24 parts by weight |
| Methanol | 130 parts by weight |
| Water | 20 parts by weight |
| 85% Phosphoric acid | 16 parts by weight |
| Si(OC₂H₅)₄ | 50 parts by weight |
| 3-Methacryloxypropyltrimethoxysilane | 30 parts by weight |
| Sol Solution L4: | |
| Phenylphosphonic acid | 0.24 parts by weight |
| Methanol | 130 parts by weight |
| Water | 20 parts by weight |
| 85% Phosphoric acid | 16 parts by weight |
| Si(OC₂H₅)₄ | 50 parts by weight |
| Allyltriethoxysilane | 25 parts by weight |

Then, AD substrates were processed with these sol solutions in the same manner as in Example 1 and Photopolymerizable Composition 4 and polyvinyl alcohol were coated thereon in the same manner as in Example 1 to obtain photosensitive lithographic printing plates.

TABLE 5

| | Substrate | Sol Solution | Photosensitive Composition | Press Life Solid | Press Life Highlight | Background Scums in Non-Image Area | Scums on Blanket |
| --- | --- | --- | --- | --- | --- | --- | --- |
| Example 3 | AD | A2 | Photopolymerizable Composition 2 | B | A | A | A |
| | " | " | Photopolymerizable Composition 3 | B | A | A | A |
| | " | " | Photopolymerizable Composition 4 | B | A | A | A |
| | " | K2 | Photopolymerizable Composition 2 | B | A | A | A |
| | " | " | Photopolymerizable Composition 3 | B | A | A | A |
| | " | " | Photopolymerizable Composition 4 | B | A | A | A |
| | " | I2 | Photopolymerizable Composition 2 | B | A | A | A |
| | " | " | Photopolymerizable Composition 3 | B | A | A | A |
| | " | " | Photopolymerizable Composition 4 | B | A | A | A |
| Comparative Example 3 | " | H2 | Photopolymerizable Composition 2 | B | A | B | B |
| | " | " | Photopolymerizable Composition 3 | B | A | B | B |
| | " | " | Photopolymerizable Composition 4 | B | A | B | B |

Further, Sol Solution H3 was prepared thoroughly in the same manner as Sol Solution A4 except that an organic phosphoric acid compound was not added and Sol Solution H4 was prepared thoroughly in the same manner as Sol Solution L4 except that an organic phosphoric acid compound was not added. AD substrates were processed with Sol Solution H3 or H4 in the same manner and thereafter, Photopolymerizable Composition 4 and polyvinyl alcohol were coated in the same manner to obtain photosensitive lithographic printing plates for comparison.

The capability of the plates obtained was evaluated in the same manner as in Example 1 and the results obtained are shown in Table 6 below.

TABLE 6

| | Substrate | Sol Solution | Photosensitive Composition | Press Life Solid | Press Life Highlight | Background Scums in Non-Image Area | Scums on Blanket |
|---|---|---|---|---|---|---|---|
| Example 4 | AD | A4 | Photopolymerizable Composition 4 | B | A | A | A |
| | " | L4 | Photopolymerizable Composition 4 | B | A | A | A |
| Comparative Example 4 | " | H3 | Photopolymerizable Composition 4 | B | A | B | B |
| | " | H4 | Photopolymerizable Composition 4 | B | A | B | B |

The photosensitive lithographic printing plates subjected to plate processing with a sol solution having mixed thereto an organic phosphoric acid compound according to the present invention were free from any deterioration in the capability of solid press life and highlight press life and surpassed the comparative lithographic printing plate in the capability with respect to the dislike for generation of background scums in the non-image area and for occurrence of scums on a blanket.

EXAMPLE 5

Sol Solution A5 was prepared in the same manner as in Example 1 by mixing the raw materials shown below.

| Sol Solution A5: | |
|---|---|
| Phenylphosphonic acid | 0.24 parts by weight |
| Methanol | 130 parts by weight |
| Water | 34 parts by weight |
| Sulfuric acid | 12 parts by weight |
| Si(OC$_2$H$_5$)$_4$ | 50 parts by weight |
| 3-Methacryloxypropyltrimethoxy-silane | 30 parts by weight |

Then, an AD substrate was processed with this sol solution in the same manner as in Example 1 and Photo-crosslinkable Composition 1 having the following composition was coated thereon to have a dry coated weight of 1.5 g/m$^2$ and dried at 80° C. for 2 minutes to form a photosensitive layer to thereby obtain a photosensitive lithographic printing plate.

| Photocrosslinkable Composition 1: | |
|---|---|
| N-[2-(Methacryloyloxy)ethyl]-2,3-dimethylmaleimide/methacrylic acid (65/35 by weight) copolymer | 5 parts by weight |
| Sensitizer having a chemical formula shown below | 0.25 parts by weight |

-continued

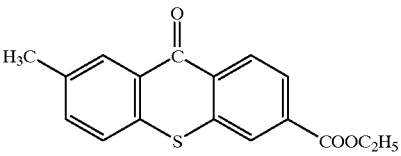

| Propylene glycol monolnethyl ether | 80 parts by weight |
|---|---|
| Methyl ethyl ketone | 80 parts by weight |
| Megafac F-177 (fluorine nonionic surface active agent, produced by Dainippon Ink and Chemicals, Inc.) | 0.03 parts by weight |
| Plasticizer 10% dispersion of copper phthalocyanine pigment (CL Pigment Blue 15) | 1 part by weight |

Further, Sol Solution H5 was prepared thoroughly in the same manner as Sol Solution A5 except that an organic phosphoric acid compound was not added, an AD substrate was processed in the same manner using this solution, and Photo-crosslinkable Composition 1 was coated thereon in the same manner to obtain a photosensitive lithographic printing plate for comparison.

These photosensitive lithographic printing plates each was image-exposed to PS Light manufactured by Fuji Photo Film Co., Ltd. from a distance of 1 m for 1 minute using a negative film, and developed using a solution obtained by diluting an aqueous alkali developer DP-4 produced by Fuji Photo Film Co., Ltd., with tap water at a volume ratio of 1:7 and a solution obtained by diluting a gum solution FP produced by Fuji Photo Film Co., Ltd., with tap water at a volume ratio of 1:1, in an automatic processor PS-800H manufactured by Fuji Photo Film Co., Ltd. Thereafter, the plates each was subjected to a printing test in a printing machine GTO manufactured by Heidelberg Co., Ltd. The results obtained are shown in Table 7 below.

TABLE 7

| | Substrate | Sol Solution | Photosensitive Composition | Press Life Solid | Press Life Highlight | Background Scums in Non-Image Area | Scums on Blanket |
|---|---|---|---|---|---|---|---|
| Example 5 | AD | A5 | Photocrosslinkable Composition 1 | B | B | A | A |
| Comparative Example 5 | " | H5 | Photocrosslinkable Composition 1 | B | B | B | B |

The photosensitive lithographic printing plate subjected to plate processing with a sol solution having mixed thereto an organic phosphoric acid compound according to the present invention was free from any deterioration in the capability of solid press life and highlight press life and surpassed the comparative lithographic printing plate in the capability with respect to the dislike for generation of background scums in the non-image area and for occurrence of scums on a blanket.

EXAMPLE 6

Sol Solution A6 was prepared in the same manner as in Example 1 by mixing the raw materials shown below.

| Sol Solution A6: | |
|---|---|
| Phenylphosphonic acid | 0.24 parts by weight |
| Methanol | 130 parts by weight |
| Water | 20 parts by weight |
| 85% Phosphoric acid | 16 parts by weight |
| $Si(OC_2H_5)_4$ | 50 parts by weight |
| 3-Methacryloxypropyltrimethoxy-silane | 30 parts by weight |

Then, an SI substrate was processed with this sol solution in the same manner as in Example 1 and Negative Composition 1 having the following composition was coated thereon to have a dry coated weight of 1.5 g/m² and dried at 80° C. for 2 minutes to form a photosensitive layer to thereby obtain a photosensitive lithographic printing plate.

| Negative Composition 1: | |
|---|---|
| Hexafluorophosphate of condensate of 4-diazodiphenylainine with formaldehyde | 1.0 parts by weight |
| Polymer (a) | 5.0 parts by weight |
| Malic acid | 0.05 parts by weight |
| FC-430 (fluorine surface active agent produced by U.S. 3M) | 0.05 parts by weight |
| Oil-soluble dye (Victoria Pure Blue BOH) | 0.1 part by weight |
| 2-Methoxyethanol | 60 parts by weight |
| Methanol | 20 parts by weight |
| Methyl ethyl ketone | 20 parts by weight |

Note: Polymer (a) is a vinyl copolymer described in Example 3 of JP-B-55-34929.

Further, Sol Solution H6 was prepared thoroughly in the same manner as Sol Solution A6 except that an organic phosphoric acid compound was not added, an SI substrate was processed in the same manner using this solution, and Negative Composition 1 was coated thereon in the same manner to obtain a photosensitive lithographic printing plate for comparison.

These photosensitive lithographic printing plates each was image-exposed to PS Light manufactured by Fuji Photo Film Co., Ltd. from a distance of 1 m for 1 minute using a negative film, and developed using a solution obtained by diluting an aqueous alkali developer DN-3C produced by Fuji Photo Film Co., Ltd., with tap water at a volume ratio of 1:1 and a solution obtained by diluting a gum solution FN-2 produced by Fuji Photo Film Co., Ltd., with tap water at a volume ratio of 1:1, in an automatic processor PS-800H manufactured by Fuji Photo Film Co., Ltd. Thereafter, the plates each was subjected to a printing test in a printing machine GTO manufactured by Heidelberg Co., Ltd. The results obtained are shown in Table 8 below.

TABLE 8

| | Substrate | Sol Solution | Photosensitive Composition | Press Life Solid | Press Life Highlight | Background Scums in Non-Image Area | Scums on Blanket |
|---|---|---|---|---|---|---|---|
| Example 6 | SI | A6 | Negative Composition 1 | B | B | A | A |
| Comparative Example 6 | " | H6 | Negative Composition 1 | B | B | B | B |

The photosensitive lithographic printing plate subjected to plate processing with a sol solution having mixed thereto an organic phosphoric acid compound according to the present invention was free from any deterioration in the capability of solid press life and highlight press life and surpassed the comparative lithographic printing plate in the capability with respect to the dislike for generation of background scums in the non-image area and for occurrence of scums on a blanket.

EXAMPLE 7

An AD substrate was processed in the same manner as in Example 1 with Sol Solution A6 described in Example 6, and Positive Composition 1 having the following composition was coated thereon to have a dry coated weight of 1.5 g/m² and dried at 80° C. for 2 minutes to form a photosensitive layer to thereby obtain a photosensitive lithographic printing plate.

TABLE 9

| | Substrate | Sol Solution | Photosensitive Composition | Press Life Solid | Press Life Highlight | Background Scums in Non-Image Area | Scums on Blanket |
|---|---|---|---|---|---|---|---|
| Example 7 | AD | A6 | Negative Composition 1 | B | B | A | A |
| Comparative Example 7 | " | H6 | Negative Composition 1 | B | B | B | B |

| Positive Composition 1: | |
|---|---|
| Esterified product of 1,2-diazonaphthoquinone-5-sulfonyl chloride with pyrogallol-acetone resin (compound described in Example of U.S. Pat. 3,635,709) | 45 parts by weight |
| Cresol-formaldehyde novolak resin | 110 parts by weight |
| 2-(p-Methoxyphenyl)-4,6-bis-(trichloromethyl)-s-triazine | 2 parts by weight |
| Oil Blue #603 (produced by Orient Chemical Co., Ltd.) | 1 part by weight |
| Megafac F-177 (fluorine nonionic surface active agent, produced by Dainippon Ink and Chemicals, Inc.) | 0.4 parts by weight |
| Methyl ethyl ketone | 100 parts by weight |
| Propylene glycol monoethyl ether | 100 parts by weight |

Further, using Sol Solution H6 prepared in Example 6 thoroughly in the same manner as Sol Solution A6 except that an organic phosphoric acid compound was not added, an AD substrate was processed in the same manner, and Positive Composition 1 was coated thereon in the same manner to obtain a photosensitive lithographic printing plate for comparison.

These photosensitive lithographic printing plates each was image-exposed to PS Light manufactured by Fuji Photo Film Co., Ltd. from a distance of 1 m for 1 minute using a negative film, and developed using a solution obtained by diluting an aqueous alkali developer DP-4 produced by Fuji Photo Film Co., Ltd., with tap water at a volume ratio of 1:1 and a solution obtained by diluting a gum solution FP produced by Fuji Photo Film Co., Ltd., with tap water at a volume ratio of 1:1, in an automatic processor PS-800H manufactured by Fuji Photo Film Co., Ltd. Thereafter, the plates each was subjected to a printing test in a printing machine GTO manufactured by Heidelberg Co., Ltd. The results obtained are shown in Table 9 below.

The photosensitive lithographic printing plate subjected to plate processing with a sol solution having mixed thereto an organic phosphoric acid compound according to the present invention was free from any deterioration in the capability of solid press life and highlight press life and surpassed the comparative lithographic printing plate in the capability with respect to the dislike for generation of background scums in the non-image area and for occurrence of scums on a blanket.

According to the present invention, a larger number of polymerizable functional groups can be integrated into a sol-gel processing solution of which hydrophilicity has been conventionally difficult to control, and as a result, not only light adhesion can proceed efficiently but also scums can be prevented without impairing hydrophilicity of the non-image area.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate comprising a substrate having provided on a surface thereof a photosensitive layer and an intermediate layer between the substrate and the photosensitive layer, said intermediate layer being formed by coating and drying a composition prepared by hydrolyzing and polycondensing a compound represented by formula (I) in a solvent having dissolved therein a phenol having a molecular weight of 1,000 or less or an organic phosphoric acid compound:

$$A_m M(R)_n \qquad (I)$$

wherein M represents silicon, aluminum, titanium or zirconium, A represents a hydrogen atom, an alkyl group, an aryl group, an alkenyl group, a propargyl group, an alkoxy group, an epoxyalkyl group, a silyl group, a siloxy group or a functional group capable of addition reaction by a radical, and R represents one of the following groups (a) to (e):

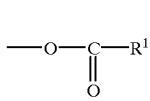

(a)

-continued

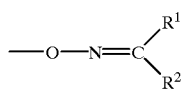
(b)

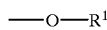
(c)

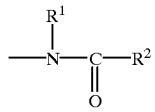
(d)

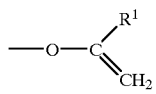
(e)

wherein $R^1$ and $R^2$, which may be the same or different, each represents an alkyl group, an alkenyl group or an aryl group, m and n each represents 0 or a positive integer, provided that m+n=3 or 4, when m is 2 or greater, the A groups may be the same or different, and when n is 2 or greater, the R groups may be the same or different.

2. The photosensitive lithographic printing plate of claim 1, wherein, in hydrolyzing and polycondensing the compound represented by formula (I), the phenol having a molecular weight of 1,000 or less or an organic phosphoric acid compound is used in a molar amount of 1/10 to 1/200 times (by mole) the molar amount of the compound represented by formula (I).

3. The photosensitive lithographic printing plate of claim 1, wherein $R^1$ and $R^2$ each represents a substituted or unsubstituted alkyl group having 1 to 20 carbon atoms, a substituted or unsubstituted alkenyl having 2 to 20 carbon atoms, or a substituted or unsubstituted aryl having 6 to 20 carbon atoms.

4. The photosensitive lithographic printing plate of claim 1, wherein the organic phosphoric acid compound is at least one compound selected from the group consisting of (1) a substituted or unsubstituted aliphatic or aromatic compound represented by $R^3$—$(PO(OH)_2)_n$, and (2) a substituted or unsubstituted aliphatic or aromatic compound represented by $R^3$—$(PO(OH)(R^4))_n$:
wherein n is 1 or 2;
when n is 1, $R^3$ and $R^4$ each is an alkyl group, an alkoxy group, an aryloxy group, an aryl group, an acyl group or an acyloxy group, which may have substituent(s);
when n is 2, $R^3$ is an alkylene group or an arylene group, which may have substituent(s), and $R^4$ has the same meaning as defined above; and
the substituent is one selected from the group consisting of an alkyl group as the substituent to the aryl residue, an aryl group as the substituent to the alkyl residue, an alkoxy group, an acyl group, an acyloxy group, an aryloxy group, a vinyl group, a hydroxyl group, a carboxyl group, a cyano group, a nitro group and a halogen atom.

5. The photosensitive lithographic printing plate of claim 1, wherein the organic phosphoric acid compound is at least one compound represented by:

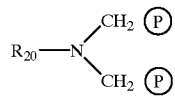

wherein Ⓟ represents —$PO_3H_2$, —$OPO_3H_2$ or a salt thereof, and $R_{20}$ represents an alkyl group, an alkoxy group, an aryloxy group, an aryl group, an acyl group or an acyloxy group, which may have substituent(s).

6. A photosensitive lithographic printing plate comprising a substrate having provided on a surface thereof a photopolymerizable photosensitive layer and an intermediate layer between the substrate and the photosensitive layer, said intermediate layer being formed by coating and drying a composition prepared by hydrolyzing and polycondensing a compound represented by the following formula (II) having a functional group capable of addition reaction by a radical in a solvent having dissolved therein a phenol having a molecular weight of 1,000 or less or an organic phosphoric acid compound:

$$A'_m M(R)_n \quad (II)$$

wherein M represents silicon, aluminum, titanium or zirconium, A' represents a functional group capable of addition reaction by a radical, R represents one of the following groups (a) to (e):

(a)

(b)

(c)

(d)

(e)

wherein $R^1$ and $R^2$, which may be the same or different, each represents an alkyl group, an alkenyl group or an aryl group, m and n each represents 0 or a positive integer, provided that m+n=3 or 4, when m is 2 or greater, the A groups may be the same or different, and when n is 2 or greater, the R groups may be the same or different.

* * * * *